US008265569B2

(12) United States Patent
Barlow

(10) Patent No.: US 8,265,569 B2
(45) Date of Patent: Sep. 11, 2012

(54) APPARATUS AND METHOD FOR TRANSMIT/RECEIVE SWITCHING

(75) Inventor: Allen Barlow, San Diego, CA (US)

(73) Assignee: Analog Devices, Inc., Norwood, MA (US)

( * ) Notice: Subject to any disclaimer, the term of this patent is extended or adjusted under 35 U.S.C. 154(b) by 311 days.

(21) Appl. No.: 12/559,174

(22) Filed: Sep. 14, 2009

(65) Prior Publication Data

US 2011/0063011 A1    Mar. 17, 2011

(51) Int. Cl.
  H04B 1/44    (2006.01)
  H03K 5/08    (2006.01)
(52) U.S. Cl. ................. 455/78; 327/328; 455/83
(58) Field of Classification Search ......... 455/78–83; 327/328
  See application file for complete search history.

(56) References Cited

U.S. PATENT DOCUMENTS

| | | | |
|---|---|---|---|
| 5,603,324 A * | 2/1997 | Oppelt et al. | 600/437 |
| 5,634,200 A * | 5/1997 | Kitakubo et al. | 455/82 |
| 5,659,885 A * | 8/1997 | McDonald et al. | 455/78 |
| 6,083,164 A | 7/2000 | Oppelt et al. | |
| 6,759,888 B1 * | 7/2004 | Wodnicki | 327/382 |
| 7,139,532 B2 | 11/2006 | Veillette | |
| 7,271,452 B2 * | 9/2007 | Arai | 257/371 |
| 7,314,445 B2 | 1/2008 | Wodnicki et al. | |
| 2005/0154300 A1 * | 7/2005 | Wodnicki et al. | 600/437 |
| 2006/0260400 A1 * | 11/2006 | Goldstein | 73/514.18 |
| 2006/0281418 A1 * | 12/2006 | Huang et al. | 455/78 |
| 2008/0262357 A1 | 10/2008 | Wodnicki | |
| 2009/0115549 A1 * | 5/2009 | Lee | 333/101 |

OTHER PUBLICATIONS

Chaggares et al. "Protection Circuitry and Time Resolution in High Frequency Ultrasonic NDE," IEEE Ultrasonics Symposium, 1999, pp. 819-822.
Odom, "Ultrasound Analog Electronics Primer," Analog Dialogue, 1999, pp. 1-3, vol. 33-5.

* cited by examiner

*Primary Examiner* — Ryan Jager
(74) *Attorney, Agent, or Firm* — Knobbe Martens Olson & Bear LLP

(57) ABSTRACT

Apparatus and methods are disclosed, such as those involving an electronic device. One such apparatus includes a transmitter; a receiver; and a transmit/receive switch configured to electrically block the receiver from the transmitter during a transmit period. The transmit/receive switch includes one or more MOSFETs coupled between an input node and an output node, the input node being electrically coupled to the transmitter, the output node being electrically coupled to the receiver. The one or more MOSFETs are configured to be off during the transmit period. The transmit/receive switch further includes a clamp circuit configured to couple the output node to ground during the transmit period. This configuration effectively protects the receiver while minimizing switching artifacts.

32 Claims, 12 Drawing Sheets

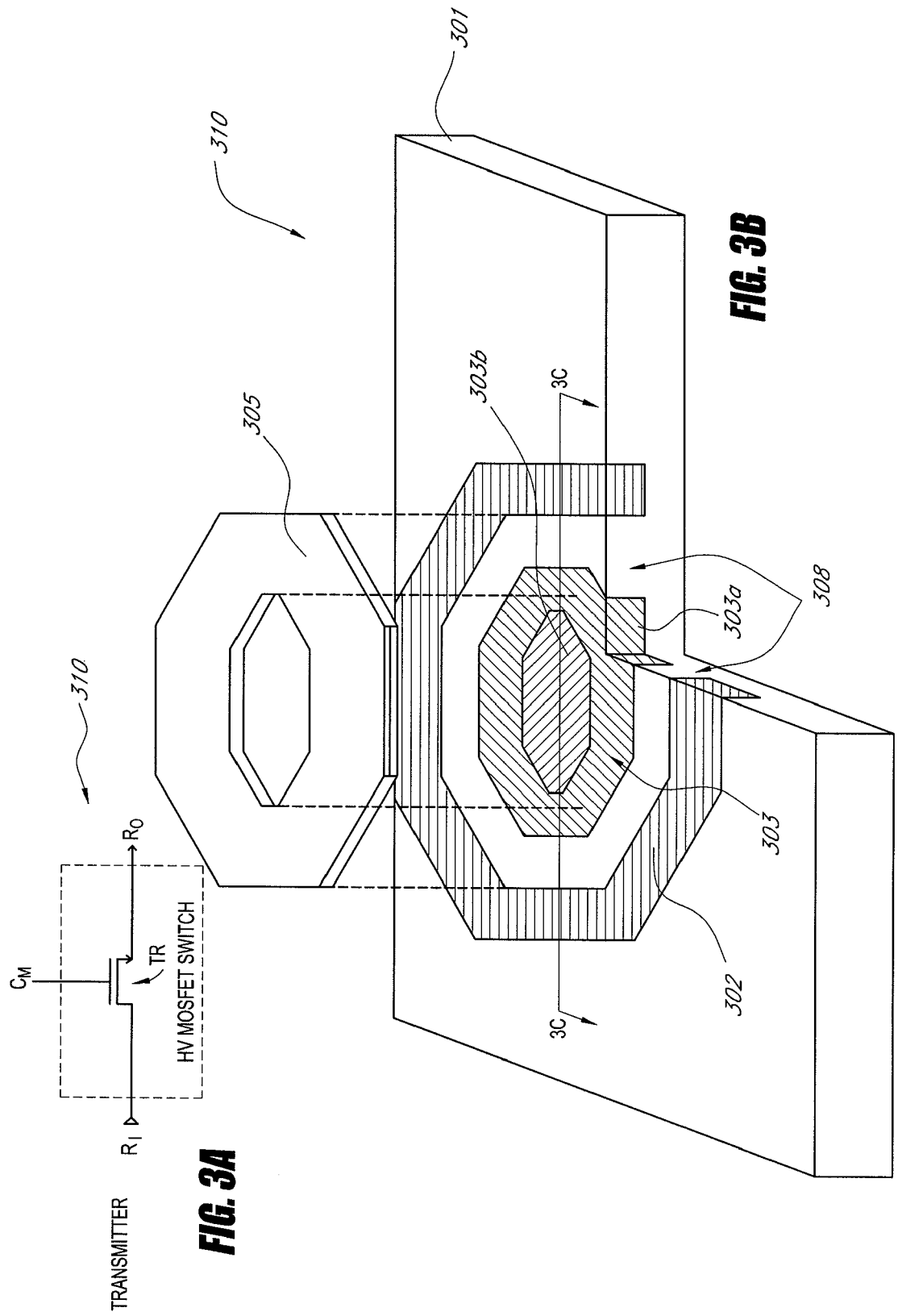

APPARATUS AND METHOD FOR TRANSMIT/RECEIVE SWITCHING

BACKGROUND

1. Field

Embodiments of the invention relate to electronic systems, and more particularly, in one or more embodiments, to transmit/receive switches for use in electronic systems.

2. Description of the Related Technology

Certain electronic systems, such as ultrasound systems, are configured to be able to transmit and receive signals. Such systems are sometimes called transmitter/receivers, transceivers, and the like. For example, an electronic system can include a transmitter configured to generate an electronic signal, and a transducer configured to convert the electronic signal into an electromagnetic or acoustic signal that can propagate through a transmission medium, such as air or liquid. Such an electronic system can have another transducer to receive and convert an electromagnetic or acoustic signal that has propagated through the transmission medium into an electronic signal. The electronic system can also include a receiver that can process the converted electronic signal to have a form suitable for a desired use.

In such an electronic system, the transmitter and the receiver can be configured to share the same transducer and the same channel leading to the transducer. During operation, however, the transmitter and the receiver alternately uses the transducer and the channel. During a transmit mode, the transmitter generates and transmits a signal through the channel and the transducer. During a receive mode, the receiver detects and processes a signal received through the transducer and the channel. In some instances, a transmit/receive (T/R) switch is used to protect the receiver from the transmitted signal during the transmit mode.

One example of such an electronic system is an ultrasound system. A transmitter in the ultrasound system can generate a high voltage pulse, which is converted into an ultrasound wave by a transducer during a short transmit period. At least a portion of the ultrasound wave may be reflected by an object, and may be detected and converted into a low voltage pulse by the transducer during a relatively long receive period. Such an ultrasound system may be used as, for example, a medical imaging system. In other instances, such an ultrasound system may be used for various other purposes, for example, for determining a distance between objects, a level of a material in a container, detection of voids and cracks, and the like.

SUMMARY

In one embodiment, an apparatus includes a transmitter coupled to an ultrasonic transducer at a first node. The transmitter is configured to generate a first signal during a transmit period. The apparatus also includes a transmit/receive switch having an input coupled to the first node. The transmit/receive switch further includes: one or more field effect transistors (FETs) coupled between the first node and a second node, wherein the one or more FETs are configured to be turned on during a receive period to couple the first node and the second node such that a second signal is passed from the first node to the second node during the receive period, and to be turned off during the transmit period to substantially block the first signal from the second node. The transmit/receive switch also includes a clamp circuit coupled to the second node, wherein the clamp circuit is configured to protect the second node from excess voltages. The apparatus further includes a receiver having an input coupled to the second node to receive a second signal during the receive period, wherein the second signal is intended to comprise echoes of the first signal.

In another embodiment, an electronic device includes a transmit/receive switch configured to electrically block a circuit from a high voltage signal during a transmit mode and to pass a low voltage signal to the circuit during a receive mode, the transmit/receive switch being coupled between an input node and an output node. The transmit/receive switch includes: a first metal-oxide-semiconductor field effect transistor (MOSFET) including a first drain electrically coupled to the input node, a first source, and a first gate; a second MOSFET including a second drain electrically coupled to the first source of the first MOSFET, a second source electrically coupled to the output node, and a second gate; a third MOSFET including a third drain electrically coupled to the input node, a third source, and a third gate; and a fourth MOSFET including a fourth drain electrically coupled to the third source of the third MOSFET, a fourth source electrically coupled to the output node, and a fourth gate.

In yet another embodiment, an ultrasound system includes: a transmitter configured to generate an ultrasonic signal during a transmit period; a receiver configured to receive an echo signal, the echo signal being a portion of the ultrasonic signal reflected by an object; and a transmit/receive switch configured to electrically block the receiver from the ultrasonic signal when the transmit/receive switch is turned off, and to pass the echo signal when the transmit/receive switch is turned on. The transmit/receive switch includes a metal-oxide-semiconductor field effect transistor (MOSFET). The MOSFET includes: a substrate; a source region formed into the substrate. The source region is annular when viewed from above the substrate. The MOSFET also includes a drain region formed into the substrate, the drain region being laterally surrounded by the source region; a channel region defined between the source and drain regions; and a gate overlying the channel region, the gate extending from over a portion of the drain region to the source region. The MOSFET does not include another gate that overlies at least a portion of the channel region and is separated from the gate extending from over the drain region to the source region.

In yet another embodiment, a method of operating an electronic device includes: generating, by a transmitter, a first signal during a transmit period; receiving, by a receiver, a second signal during a receive period; and electrically blocking the receiver from the transmitter during the transmit period, by turning off one or more metal-oxide-semiconductor field effect transistors (MOSFETs) coupled between an input node and an output node, the input node being electrically coupled to the transmitter, the output node being electrically coupled to the receiver; passing the second signal to the receiver during the receive period by turning on the one or more MOSFETs. Electrically blocking the receiver comprises coupling the output node to ground during the transmit period.

BRIEF DESCRIPTION OF THE DRAWINGS

FIG. 3A is a circuit diagram of a high voltage (HV) MOSFET switch for use in the transmit/receive switch of FIG. 2 according to one embodiment.

FIG. 3B is a schematic perspective view of a MOSFET device for use in the HV MOSFET switch of FIG. 3A according to one embodiment.

DETAILED DESCRIPTION OF EMBODIMENTS

Figure 1:
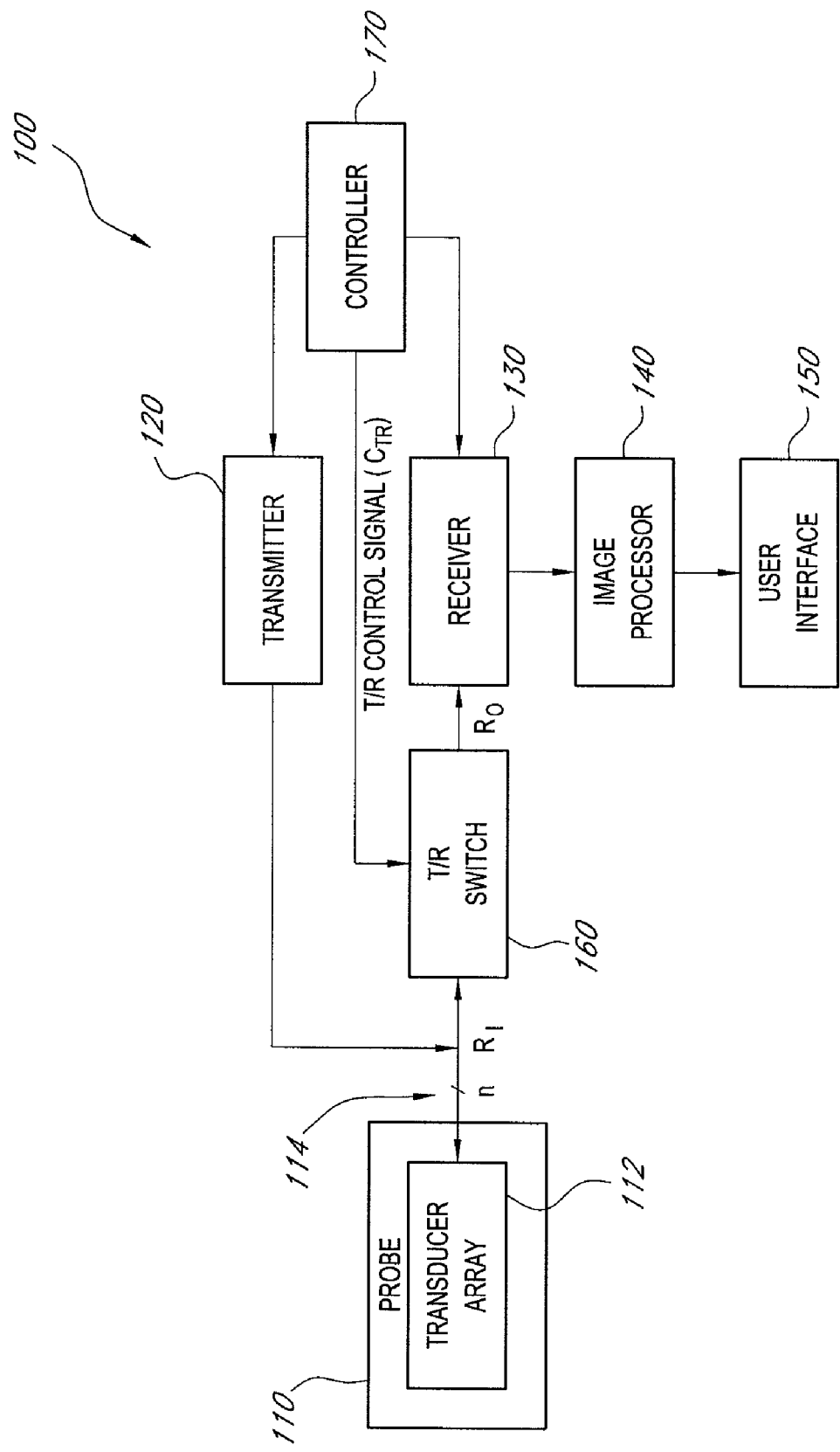
FIG. 1 is a block diagram illustrating an ultrasound system according to one embodiment.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

In some embodiments, an electronic device includes a transmitter, a receiver, and a transmit/receive switch configured to electrically block the receiver from the transmitter during a transmit period. The transmit/receive switch includes one or more MOSFETs coupled between an input node and an output node. The input node is electrically coupled to the transmitter, and the output node is electrically coupled to the receiver. The one or more MOSFETs are configured to be off during the transmit period. The transmit/receive switch further includes a clamp circuit configured to couple the output node to ground during the transmit period. This configuration effectively protects the receiver while minimizing switching artifacts.

Overview of Ultrasound System

In some embodiments, an ultrasound system may generate and transmit ultrasound signals to be transmitted toward a target, e.g., at least a portion of an object or a human or animal body. In one embodiment, the ultrasound signals can include a bipolar voltage pulse burst of about 1 to 10 cycles. The voltage pulse burst can have a frequency from about 1 to 20 MHz with a peak-to-peak amplitude ranging from about 20V to about 400V, or preferably from about 50V to about 250V. For example, the peak-to-peak amplitude can be about 200V. Such an ultrasound signal can be referred to as a "high voltage" ultrasound signal in the context of this document. The ultrasound system can also receive at least a portion of the ultrasound signals reflected by the target (hereinafter, referred to as "echo signals"), and process the echo signals for providing certain data related to the target. For example, the data can be used for generating images of objects inside the target. Such images can be used in cardiac, obstetric or many other medical diagnostic areas. The data, however, can be used for other applications, for example, for determining a distance between objects or determining the level of a liquid in a container.

Referring to FIG. 1, an ultrasound system according to one embodiment will be described below. The illustrated ultrasound system 100 includes a probe 110, a transmitter 120, a receiver 130, an image processor 140, a user interface 150, and a transmit/receive switch 160, and a controller 170.

The probe 110 serves to transmit ultrasound signals into a medium, such as air. The probe 110 can include an array of transducers 112 that are formed of a piezoelectric ceramic material, e.g., lead zirconium titanate. The transducers 112 can be connected to the transmitter 120 via a cable 114 including a plurality of channels 114.

The transmitter 120 serves to generate ultrasound signals to be transmitted from the probe 110. The transmitter 120 can include a transmit beamformer to make a pattern of ultrasound signals, and a high voltage amplifier to amplify the generated ultrasound signals.

The receiver 130 serves to detect echo signals reflected from a target. For example, the echo signals can have a voltage ranging from a few microvolts to about 1 volt. The receiver 130 can include a time-gain compensation (TGC) amplifier and an analog-to-digital converter that provide about 80 to about 100 dB dynamic range in converting the echo (analog) signal into a digital signal. In certain embodiments where the ultrasound system 100 is used for generating images, the receiver 130 can also include a beamformer that forms a beam pattern at least partly in response to the digitized echo signals. At least a portion of the echo signals can be delayed such that the echo signals arrive at the image processor 140 at the same time.

The image processor 140 serves to process the echo signals to generate images. The image processor 140 can compute the corresponding pixels of a display in the user interface 150 based at least partly on the digitized echo signals. The image processor 140 can use one or more of various modes, such as image and motion processing mode (B-mode), color Doppler processing mode (F-mode), and spectral Doppler mode (D-mode).

The user interface 150 serves to provide processed data, for example, images, to a user. The user interface 150 can include a display device (e.g., a CRT display or an LCD). In other embodiments, the user interface 150 can also include a speaker that provides audio data to the user. The user interface 150 can also include an input device, e.g., a keyboard, a keypad, or a touchscreen.

The transmit/receive (T/R) switch 160 serves to protect the receiver 130 from the high voltage ultrasound signals (e.g., signals having a peak-to-peak amplitude of about 200V) transmitted from the transmitter 120. In the illustrated embodiment, the receiver 130 includes relatively sensitive circuitry configured to sense echo signals having a relatively low voltage (e.g., a few microvolts to about 1V). The T/R switch 160 is turned off while the high voltage ultrasonic signals are transmitted from the transmitter 120, thereby protecting the receiver 130. In addition, the T/R switch 160, by being turned off, can keep the TGC amplifier of the receiver from saturation which can adversely affect the echo signal processing. The T/R switch 160 is turned on while no ultrasound signals are transmitted, allowing the receiver 130 to receiver echo signals. In the illustrated embodiment, the T/R switch 160 receives an input signal $R_I$ (either the transmitted ultrasound signal or the echo signal) and outputs it as an output signal $R_O$ when it is on, and blocks it when it is off (see also FIGS. 2, 9, and 10A).

The controller 170 serves to control the operations of the transmitter 120, the receiver 130, the image processor 140, the user interface 150, and the T/R switch 160. The controller 170 can include a microprocessor and one or more memories. The controller 170 can provide a T/R control signal $C_{TR}$ to control the operation of the T/R switch 160. A skilled artisan will appreciate that the controller 170 can generate various other signals for the operation of the ultrasound system 100.

The T/R switch 160 should be configured such that when it is on, i.e., during a receive mode, its noise contribution to the signal is negligible. In addition, the T/R switch 160 should not generate switching artifacts that could degrade the received echo signal quality when switching on and off states.

A metal-oxide-semiconductor field effect transistor (MOSFET) can be used for a T/R switch. A MOSFET offers a power advantage over a diode bridge by not requiring a bias current. However, a MOSFET has non-idealities that can adversely affect the switching operation. For example, a MOSFET can have a parasitic parallel diode, a parasitic parallel bipolar transistor, and parasitic terminal to terminal capacitance. In a silicon-on-insulator (SOI) technology, a MOSFET can also have a parallel parasitic FET. These parasitic components can impose polarity and maximum terminal to terminal voltage constraints. Thus, there is a need for a circuit for a T/R switch that is capable of blocking high voltage pulses and minimizing artifacts from switching operations while taking advantages of a low powered MOSFET.

Transmit/Receive Switch

Figure 2:
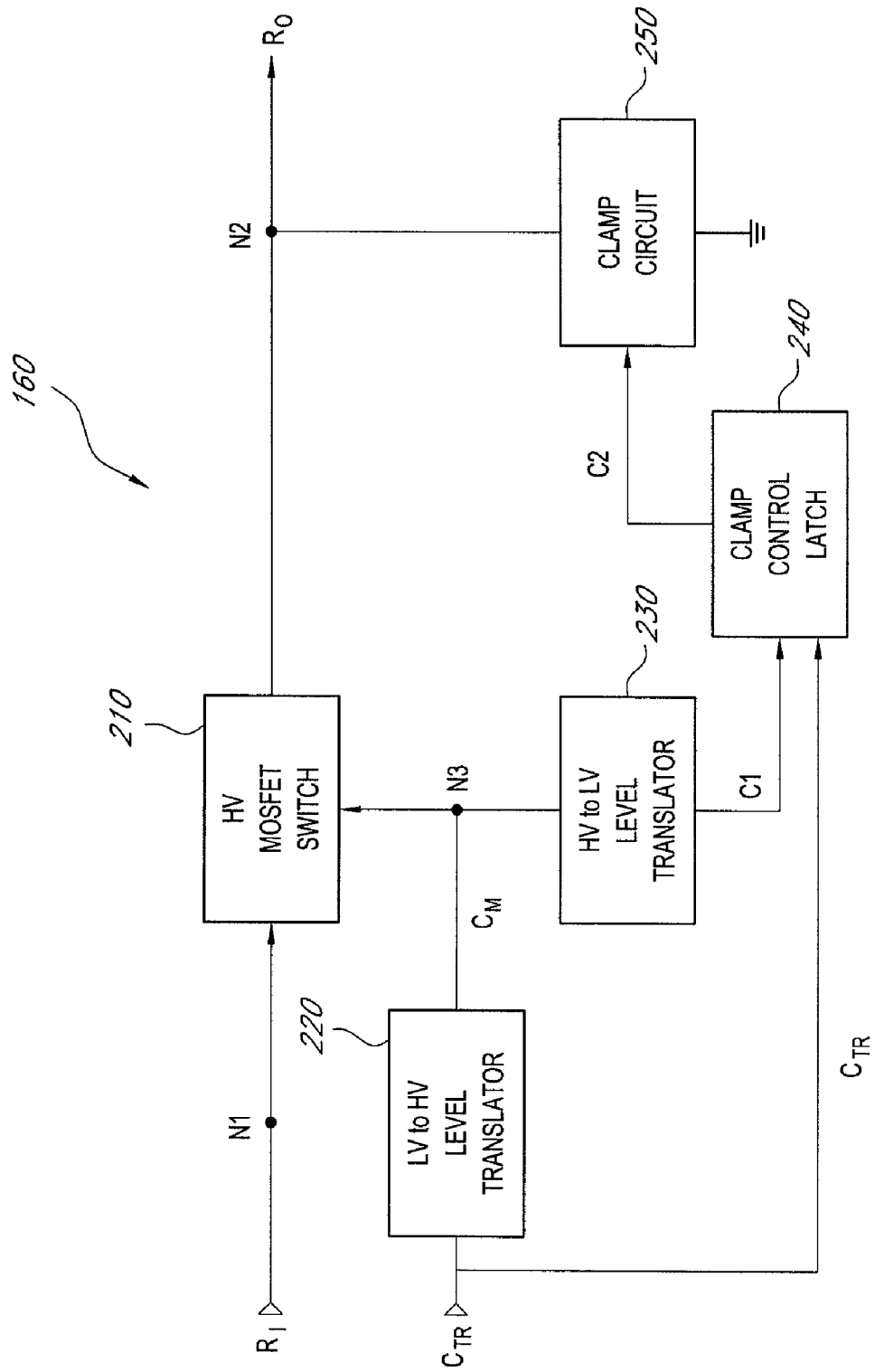
FIG. 2 is a block diagram illustrating a transmit/receive switch according to one embodiment.

In one embodiment, an ultrasound system can include a T/R switch that includes one or more MOSFETs. Referring to FIG. 2, one embodiment of the T/R switch will be described below. In the illustrated embodiment, a T/R switch 160 includes a high voltage (HV) MOSFET switch 210, a low voltage to high voltage (LV to HV) level translator 220, a high voltage to low voltage (HV to LV) level translator 230, a clamp control latch 240, and a clamp circuit 250.

The HV MOSFET switch 210 is connected between a first node N1 and a second node N2. The HV MOSFET switch 210 receives an input signal $R_I$. The HV MOSFET switch 210, when turned on, electrically connects the first node N1 to the second node N2, thereby outputting the received input signal as an output signal $R_O$. Details of the HV MOSFET switch 210 will be described below in connection with FIGS. 3A-4B.

The LV to HV level translator 220 is configured to receive a T/R control signal $C_{TR}$, and generate a MOSFET switch control signal $C_M$ at least partly in response to the T/R control signal $C_{TR}$. The MOSFET switch control signal $C_M$ is provided via a third node N3 to the HV MOSFET switch 210 to turn on or off the HV MOSFET switch 210. In one embodiment, the T/R control signal $C_{TR}$ can range between about 1V and about 6V, and the MOSFET switch control signal $C_M$ can range between about 20 V and about 200V, and preferably between about 50V and about 120V. Further details of the LV to HV level translator 220 will be described later in connection with FIGS. 6A and 6B.

The HV to LV level translator 230 is configured to receive the MOSFET switch control signal $C_M$, and generate a first clamp control signal $C_1$ at least partly in response to the MOSFET switch control signal $C_M$. In one embodiment, the first clamp control signal $C_1$ can range between about 3V and about 6V. Further details of the HV to LV level translator 230 will be described later in connection with FIG. 7.

The clamp control latch 240 is configured to receive the first clamp control signal $C_1$ and the T/R control signal $C_{TR}$, and generate a second clamp control signal $C_2$ at least partly in response to one or more of the signals $C_1$ and $C_{TR}$. The second clamp control signal $C_2$ is provided to the clamp circuit 250 to turn on or off the clamp circuit 250. The clamp control latch 240 is also configured to hold the second clamp control signal $C_2$ for a predetermined period of time, for example, during a transmit period, as will be better understood from the description below with respect to FIG. 8. In some embodiments, the clamp control latch 240 can include a pair of cross-coupled logic gates. e.g., cross-coupled NOR gates.

The clamp circuit 250 serves to reduce switching artifacts on the output signal Ro and to limit and clip any leakage of a high voltage pulse burst through the HV MOSFET switch 210 (feed-through) during a transmit mode. The clamp circuit 250 is configured to receive the second clamp control signal $C_2$. The clamp circuit 250 is also configured such that, when turned on, provides low resistance between the second node N2 and ground. The clamp circuit 250 is also configured such that, when turned off, provides high resistance between the second node N2 and ground, thereby allowing the HV MOSFET switch 210 to output the input signal $R_I$ as the output signal $R_O$. Further details of the clamp circuit 250 will be described later in connection with FIGS. 5A-5C.

One or more of the LV to HV level translator 220, the HV to LV level translator 230, and the clamp control latch 240 can provide delays to controls signals provided to the HV MOSFET switch 210 and the clamp circuit 250. In addition, some of the LV to HV level translator 220, the HV to LV level translator 230, and the clamp control latch 240 can form at least part of a feedback loop that detects when transitions of the HV MOSFET switch 210 occur, thereby providing timed delays. The delays should be timed to effectively minimize switching artifacts and feed-through during a transmit mode.

In some embodiments, the clamp circuit 250 can be turned on shortly before the HV MOSFET switch 210 is turned off, and is kept on while the HV MOSFET switch 210 is off. In addition, the clamp circuit 250 can be turned off shortly after the HV MOSFET switch 210 is turned on. In such embodiments, the clamp circuit 250 is on during all transitions of the HV MOSFET switch 210, and thus can absorb charge injection from the parasitic components of the HV MOSFET switch 210 at the second node N2. In addition, because the clamp circuit 250 is on during the entire time period in which the HV MOSFET switch 210 is off, it can also absorb any of high voltage pulse bursts that can feed through the HV MOSFET switch 210.

Figure 3C:
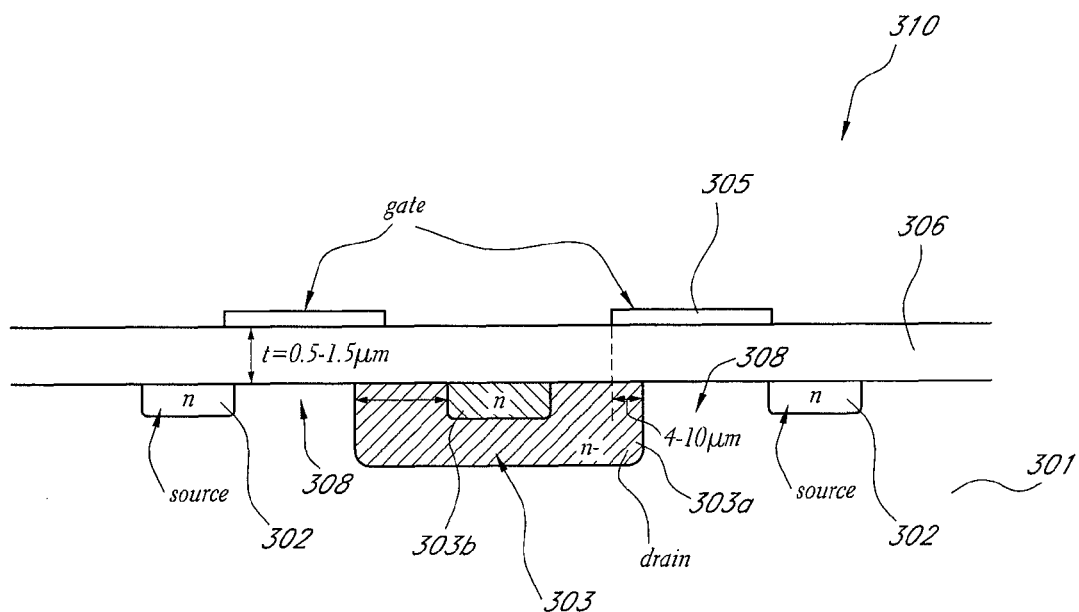
FIG. 3C is a cross-section of the MOSFET device of FIG. 3B, taken along the lines 3C-3C.

Referring to FIGS. 3A-3C, one embodiment of the HV MOSFET switch 210 of FIG. 2 will be described below. The illustrated HV MOSFET device 310 includes a single n-type MOSFET device TR. The MOSFET device TR includes a drain configured to receive the input signal $R_I$, a source configured to output the output signal $R_O$, and a gate configured to receive the MOSFET switch control signal $C_M$. In another embodiment, the HV MOSFET switch can include a single p-type MOSFET device.

In one embodiment, the MOSFET device TR can have a structure shown in FIGS. 3B and 3B. In the illustrated embodiment, the MOSFET device 310 includes a substrate 301, a source region 302, a drain region 303, a metal gate 305, an insulating layer 306 (not shown in FIG. 3B), and a channel region 308.

The source region 302 is formed in an annular trench in the substrate 301, and is doped with an n-type dopant. In the illustrated embodiment, the source region 302 has a generally octagonal shape when viewed from above the substrate 301. In another embodiment, the source region 302 can be generally ring-shaped or circular. In other embodiments, the source region 302 can have various other shapes, for example, a generally hexagonal shape. It will be understood that the edges of the actual shapes can be rounded during fabrication. In the embodiments described in connection with FIGS. 3A-3C, 4A, and 4B, the substrate 301 can be shorted to the source region 302.

The drain region 303 is formed in another trench formed in the substrate 301. The trench for the drain region 303 is laterally inside a region enclosed by the ring-shaped source region 302. The drain region 303 can include an n minus (n−) region lightly doped with an n-type dopant, and an n region heavily doped with the n-type dopant. The n region is surrounded laterally by a portion of the n− region, and overlies another portion of the n− region, as shown in FIG. 3C. A distance between a side surface of the n region 303b and the channel region 308 can be about 10 μm to about 20 μm.

The metal gate 305 has an annular shape, and extends over a channel region 308 formed between the source and drain regions 302, 303. The metal gate 305 can extend slightly over the source and/or drain regions 302, 303. In the illustrated embodiment, the metal gate 305 can extend over edge portions of the n− region 303b of the drain region 303 by about 4 μm to about 10 μm. The metal gate 305 can be spaced apart from the top surface of the channel region 308 by about 0.5 μm to about 1.5 μm. In one embodiment, the metal gate 305 is formed of a metal, such as copper or aluminum. In another embodiment, the metal gate 305 may include a metal and any other suitable material, such as polysilicon. In other embodiments, the metal gate may be formed of any suitable material, such as polysilicon.

The insulating layer 306 is interposed between the metal gate 305 and the structure below the insulating layer 306, which can include the source region 302, the drain region 303, and the channel region 308, thereby electrically insulating the metal gate 305. The MOSFET device 310 is able to withstand high voltages from drain to gate, source to gate and drain to source. Hence, the insulating layer 306 of the MOSFET device 310 is thicker than that of a conventional MOSFET device.

In the context of this document, the MOSFET device 310 described above can be referred to as a "high voltage (HV) single gate MOSFET device," "high voltage (HV) single gate MOSFET," "high voltage (HV) single gate transistor," "single gate MOSFET device," "single gate MOSFET," or "single gate transistor." A skilled artisan will, however, will appreciate that the shapes and dimensions of the components of the MOSFET device are not limited to those described above.

Figure 3D:
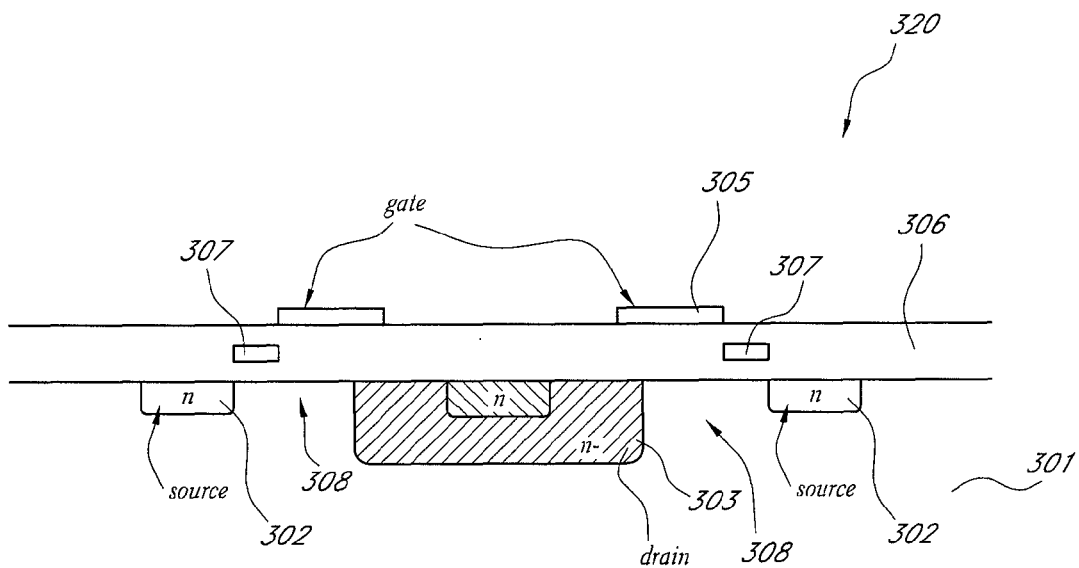
FIG. 3D is a cross-section of a conventional dual gate high voltage MOSFET device.

The HV single gate MOSFET device 310 can be distinguished from a prior art "high voltage (HV) dual gate MOSFET device" 320, as shown in FIG. 3D. The dual gate MOSFET device 320 can have a structure similar to the HV single gate MOSFET device 310. The illustrated dual gate MOSFET device 320 can includes a substrate 301, a source region 302, a drain region 303, a metal gate 305, an insulating layer 306, and a channel region 308.

The dual gate MOSFET device 320 further includes a second gate 307 close to the source region 302. The second gate 307 can be spaced apart from the metal gate 305 while overlying the channel region 308. The second gate 307 is positioned vertically closer to a top surface of the channel region 308 than the metal gate 305. The second gate 307 may or may not be electrically coupled to the metal gate 308. The second gate 307 can be formed of a material including, but not limited to, polysilicon, and can be referred to as a polysilicon gate in the context of this document. Further, the metal gate 305 of the dual gate MOSFET device 320 should not extend over the source region 302, and only slightly overlie the second gate 307. In some instances, the dimensions of the components of the dual gate MOSFET device 320 can differ from those of the components of the HV single gate MOSFET device 310. In the context of this document, a MOSFET device having both the metal gate and the second gate can be generally referred to as a "high voltage (HV) dual gate MOSFET device," "dual gate MOSFET device," "dual gate MOSFET device," or "dual gate transistor."

Figure 4A:
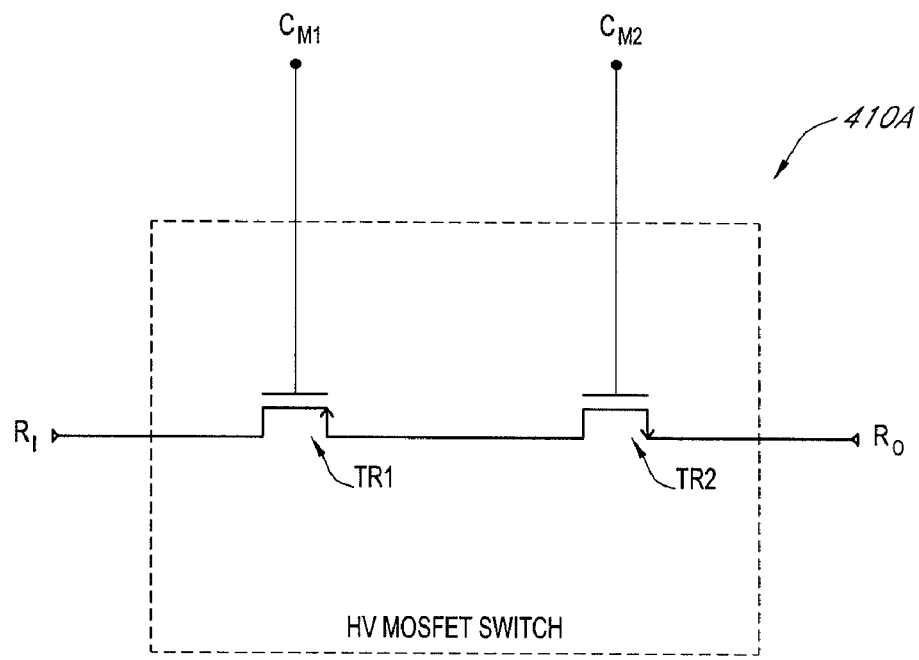
FIG. 4A is a circuit diagram of a high voltage (HV) MOSFET switch for use in the transmit/receive switch of FIG. 2 according to another embodiment.

Referring to FIG. 4A, another embodiment of the HV MOSFET switch 210 of FIG. 2 will be described below. In the illustrated embodiment, a HV MOSFET switch 410A includes a first transistor TR1 and a second transistor TR2 connected in series. In the illustrated embodiment, the first transistor TR1 is a p-type MOSFET device and the second transistor TR2 is an n-type MOSFET device. In another embodiment, the first transistor TR1 can be an n-type MOSFET device while the second transistor TR2 is a p-type MOSFET device. In one embodiment, each of the first and second transistors TR1, TR2 can be a HV single gate MOSFET.

The first transistor TR1 includes a drain configured to receive the input signal $R_I$, a source connected to the drain of the second transistor TR2, and a gate configured to receive a first MOSFET switch control signal $C_{M1}$. The first transistor TR1 can be switched between Vnn and about Vss, in response to the first MOSFET switch control signal $C_{M1}$. Vnn can be from about −20V to about −200V, and preferably from about −50V and about −120V, for example, about −100V. Vss can be about 0V. The first transistor TR1 is "on" or low resistance when the first MOSFET switch control signal $C_{M1}$ is low, and is "off" or high resistance when the first MOSFET switch control signal $C_{M1}$ is high. In an off state, the first transistor TR1 can block the negative portions of a high voltage ultrasound signal.

The second transistor TR2 includes a drain connected to the source of the first transistor TR1, a source configured to output an output signal $R_O$, and a gate configured to receive a second MOSFET switch control signal $C_{M2}$. The second transistor TR2 can be switched between about Vss and Vpp, in response to the second MOSFET switch control signal $C_{M2}$. Vpp can be from about 20 V to about 200V, and preferably from about 50V and about 120V, for example, about +100V. The first transistor TR2 is on when the second MOSFET switch control signal $C_{M2}$ is high, and is off when the second MOSFET switch control signal $C_{M2}$ is low. In an off state, the second transistor TR2 can block the positive portions of a high voltage ultrasound signal.

Figure 4B:
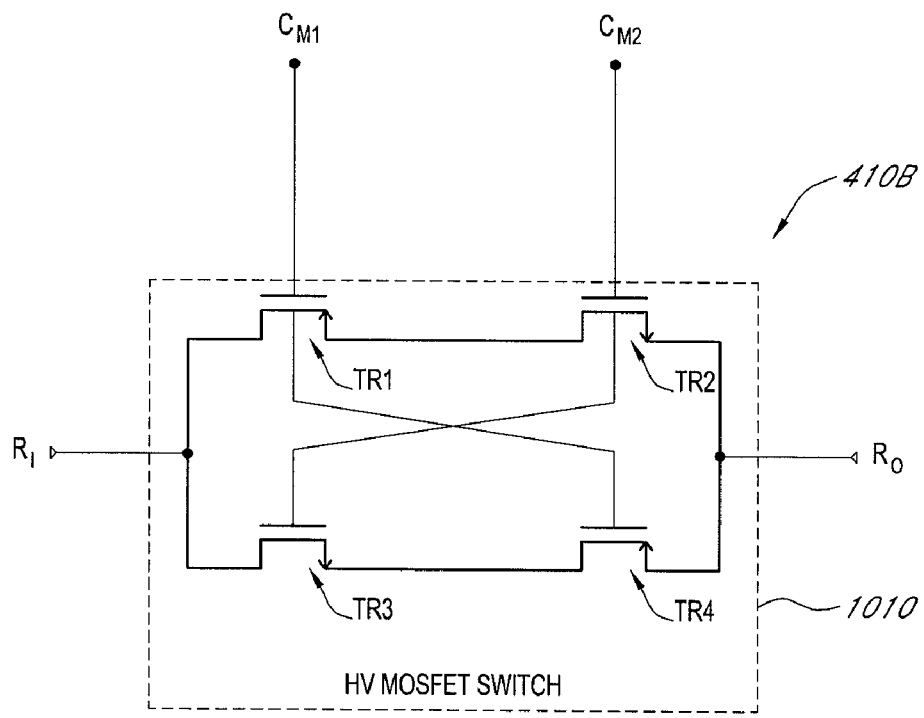
FIG. 4B is a circuit diagram of a high voltage (HV) MOSFET switch for use in the transmit/receive switch of FIG. 2 according to yet another embodiment.

Referring to FIG. 4B, yet another embodiment of the HV MOSFET switch 210 of FIG. 2 will be described below. The illustrated HV MOSFET switch 410B includes a first transistor TR1 and a second transistor TR2 connected in series. The HV MOSFET switch 410B also includes a third transistor TR3 and a fourth transistor TR4 connected in series. The first and second transistors TR1, TR2 are connected to the third and fourth transistors TR3, TR4 in parallel.

In the illustrated embodiment, the first transistor TR1 is a p-type MOSFET device and the second transistor TR2 is an n-type MOSFET device. In addition, the third transistor TR3 is an n-type MOSFET device and the fourth transistor TR4 is a p-type MOSFET device. In another embodiment, the first and fourth transistors TR1, TR4 can be n-type MOSFET devices while the second and third transistors TR2, TR3 can be p-type MOSFET devices. In one embodiment, each of the first to fourth transistors TR1-TR4 can be a HV single gate MOSFET.

The first transistor TR1 includes a drain configured to receive the input signal $R_I$, a source connected to the drain of the second transistor TR2, and a gate configured to receive a first MOSFET switch control signal $C_{M1}$. The second transistor TR2 includes a drain connected to the source of the first transistor TR1, a source configured to output an output signal $R_O$, and a gate configured to receive a second MOSFET switch control signal $C_{M2}$.

The third transistor TR3 includes a drain configured to receive the input signal $R_I$, a source connected to the drain of the fourth transistor TR4, and a gate configured to receive the second MOSFET switch control signal $C_{M2}$. The fourth transistor TR4 includes a drain connected to the source of the third transistor TR3, a source configured to output an output signal $R_O$, and a gate configured to receive the first MOSFET switch control signal $C_{M1}$. A skilled artisan will appreciate that other configurations of HV MOSFET switches can also be used in place of any of the circuits of FIGS. 3A, 4A, and 4B.

The first to fourth transistors TR1-TR4 can be designed, positioned, and sized to have closely similar parasitic components, e.g., parasitic capacitances. The transistors TR1-TR4 are driven to their on and off states in tandem. Such operation can substantially cancel the on-to-off switching artifacts or off-to-on switching artifacts at the input and output of the HV MOSFET switch.

In the embodiments described above in connection with FIGS. 4A and 4B, each of the transistors can be configured to withstand high voltages and have a low on resistance to minimize their noise contribution to the received echo signals. In certain embodiments, at least one of the transistors can have a structure shown in FIGS. 3A and 3B.

Figure 5A:
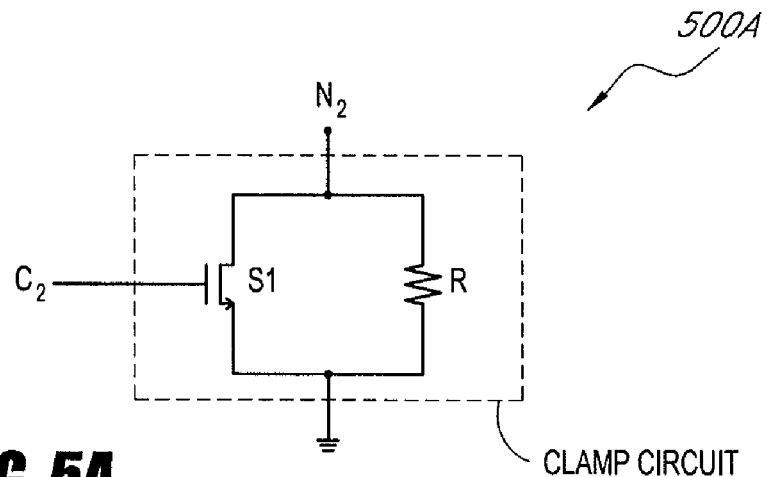
FIGS. 5A-5C are circuit diagrams of clamp circuits for use in the transmit/receive switch of FIG. 2 according to some embodiments.
Figure 5B:
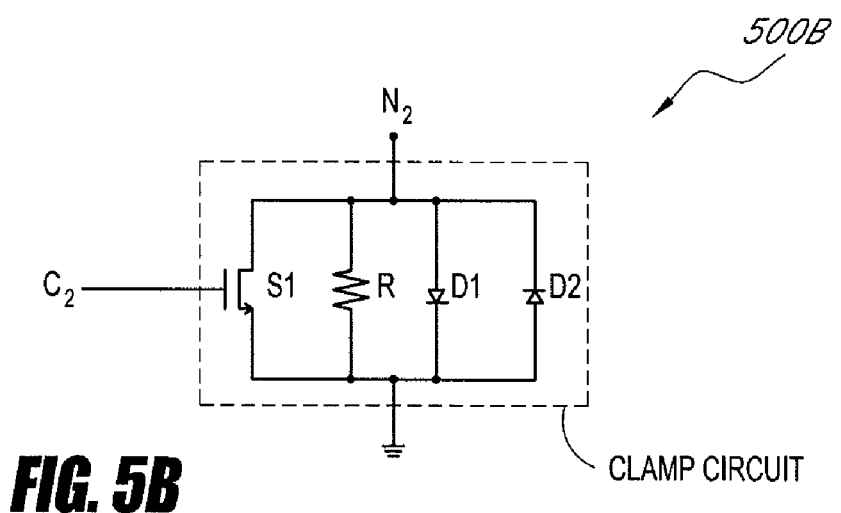
Figure 5C:
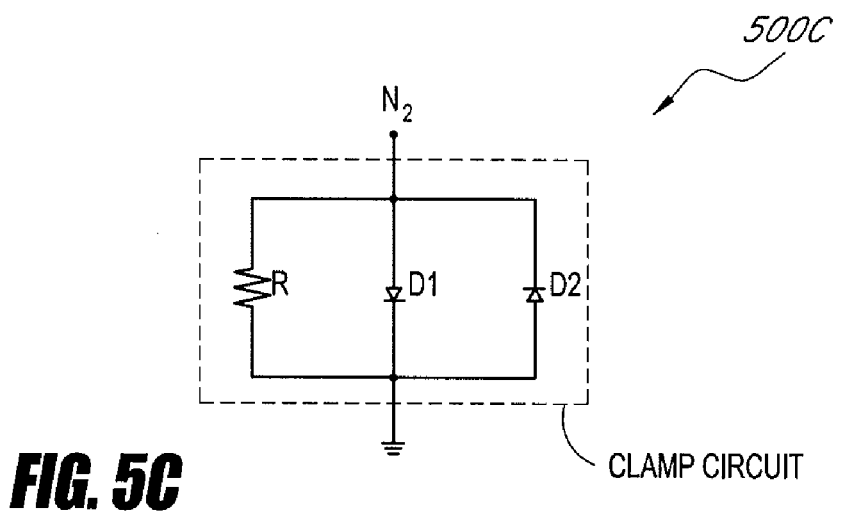

Referring to FIGS. 5A-5C, some embodiments of the clamp circuit 250 of FIG. 2 will be described below. Referring first to FIG. 5A, a clamp circuit 500A according to one embodiment includes a transistor S1 and a resistor R connected in parallel. The transistor S1 includes a drain connected to the second node N2 of the circuit of FIG. 2, a source connected to ground, and a gate configured to receive the second clamp control signal $C_2$ of FIG. 2. In one embodiment, the transistor S1 can be a low voltage MOSFET that can be switched by, for example, a control signal ranging from about 3V to about 10V, for example, about 5V. The resistor R includes a first end connected to the second node N2 of the circuit of FIG. 2, and a second end connected to ground. The resistor R may have a resistance between about 5,000Ω and about 20,000Ω.

Referring to FIG. 5B, a clamp circuit 500B according to another embodiment includes a transistor S1, a resistor R, a first diode D1, and a second diode D2 connected in parallel. The transistor S1 includes a drain connected to the second node N2 of the circuit of FIG. 2, a source connected to ground, and a gate configured to receive the second clamp control signal $C_2$ of FIG. 2. The resistor R includes a first end connected to the second node N2 of the circuit of FIG. 2, and a second end connected to ground. The first diode D1 includes an anode connected to the second node N2 of the circuit of FIG. 2, and a cathode connected to ground. The second diode D2 includes a cathode connected to the second node N2 of the circuit of FIG. 2, and an anode connected to ground. In certain embodiments, the first and second diodes D1 and D2 can be Schottky diodes.

Referring to FIG. 5C, a clamp circuit 500C according to yet another embodiment includes a resistor R, a first diode D1, and a second diode D2 connected in parallel. The resistor R includes a first end connected to the second node N2 of the circuit of FIG. 2, and a second end connected to ground. The first diode D1 includes an anode connected to the second node N2 of the circuit of FIG. 2, and a cathode connected to ground. The second diode D2 includes a cathode connected to the second node N2 of the circuit of FIG. 2, and an anode connected to ground. In certain embodiments, the first and second diodes D1 and D2 can be Schottky diodes. A skilled artisan will appreciate that other configurations of clamp circuits can also be used in place of any of the circuits of FIGS. 5A-5C.

Figure 6A:
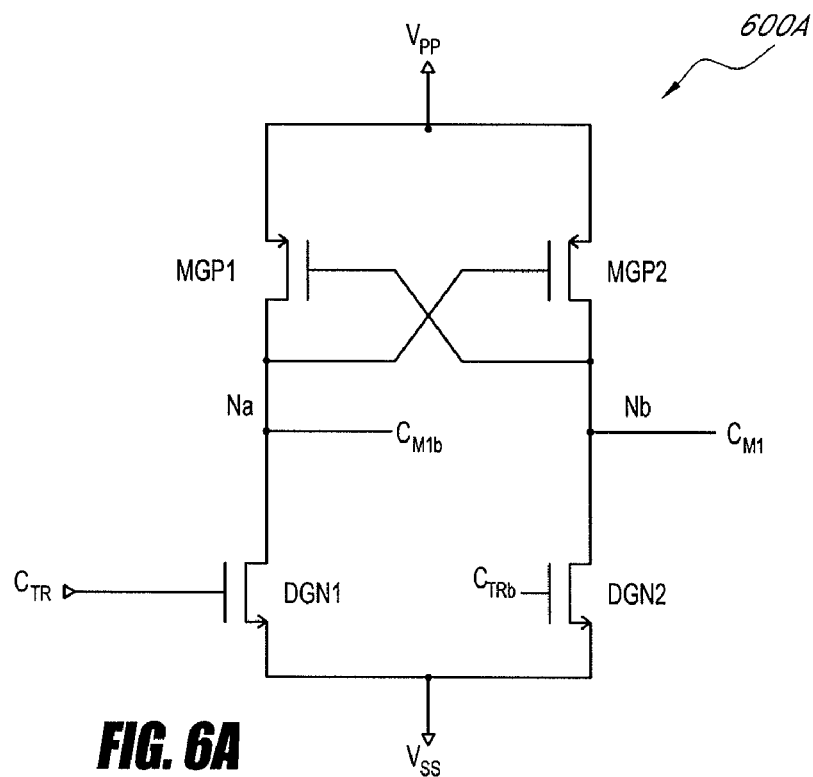
FIG. 6A is a circuit diagram of a low voltage (LV) to high voltage (HV) level translator for use in the transmit/receive switch of FIG. 2 according to one embodiment.
Figure 6B:
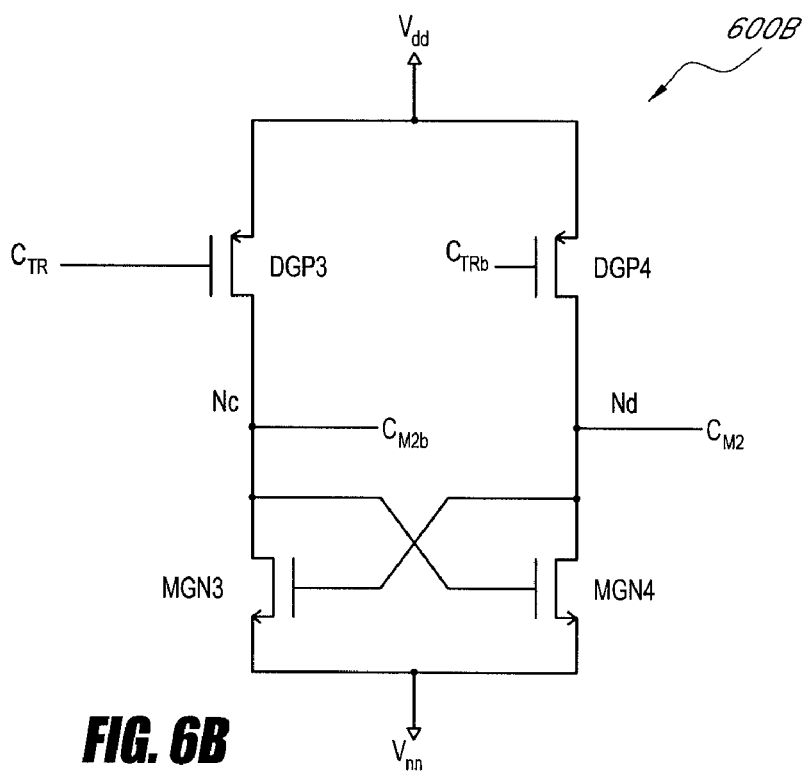
FIG. 6B is a circuit diagram of a low voltage (LV) to high voltage (HV) level translator for use in the transmit/receive switch of FIG. 2 according to another embodiment.

Referring to FIGS. 6A and 6B, some embodiments of the LV to HV level translator 220 of FIG. 2 will be described below. In some embodiments, LV to HV level translator circuits 600A and 600B shown in FIGS. 6A and 6B can form at least part of the LV to HV level translator 220 of FIG. 2. For example, the LV to HV level translator 220 of FIG. 2 can include either or both of the LV to HV level translator circuits 600A and 600B.

Referring first to FIG. 6A, the LV to HV level translator circuit 600A can serve to provide a control signal, for example, the MOSFET switch control signal $C_M$ in FIG. 2 in response to another control signal, for example, the T/R control signal $C_{TR}$ of FIG. 2. In certain embodiments, the LV to HV level translator circuit 600A can provide a control signal supplied to the gate of an n-type transistor, for example, TR of FIG. 3, TR2 of FIG. 4A, or TR2 and TR3 of FIG. 4B.

In the illustrated embodiment, the LV to HV level translator circuit 600A includes a first HV single gate transistor MGP1 and a second HV single gate transistor MGP2 cross-coupled to each other. The first HV single gate transistor MGP1 can include a source coupled to a first voltage source Vpp, a drain coupled to a first translator node Na, and a gate coupled to a second translator node Nb. The first voltage source Vpp can have a voltage between about 20 V and about 200V, and preferably between about 50V and about 120V, for example, +100V. A first MOSFET switch control signal $C_{M1}$ can be outputted from the second translator node Nb and an inverted first MOSFET switch control signal $C_{M1b}$ can be outputted from the first translator node Na.

The second HV single gate transistor MGP2 can include a source coupled to the first voltage source Vpp, a drain coupled to the second translator node Nb, and a gate coupled to the first translator node Na. The first HV single gate transistor MGP1 and the second HV single gate transistor MGP2 are p-type transistors.

The LV to HV level translator circuit 600A also includes a first dual gate transistor DGN1 and a second dual gate transistor DGN2. The first dual gate transistor DGN1 can include a drain coupled to the first translator node Na, a source coupled to a second voltage source Vss, and a gate configured to receive a control signal, for example, the T/R control signal $C_{TR}$ of FIG. 2. The second voltage source Vss can have a voltage of, for example, 0V. The second dual gate transistor DGN2 can include a drain coupled to the second translator node Nb, a source coupled to the second voltage source Vss, and a gate configured to receive an inverted control signal, for example, a signal $C_{TRb}$ inverted from the T/R control signal $C_{TR}$ of FIG. 2.

In some embodiments, the configurations of the HV single gate transistors MGP1, MGP2 and the dual gate transistors DGN1, DGN2 can be as described above in connection with FIGS. 3B-3D. A skilled artisan will, however, appreciate that the HV single gate transistors MGP1, MGP2 and the dual gate transistors DGN1, DGN2 can be replaced with any other suitable transistors or switching devices.

During the operation of the LV to HV level translator circuit 600A, one of the first and second dual gate transistors DGN1, DGN2 is on whereas the other of the transistors DGN1, DGN2 is off, depending on the voltage level of the T/R control signal $C_{TR}$. When the first dual gate transistor DGN1 is on (the second dual gate transistor DGN2 is off), the second HV single gate transistor MGP2 is on whereas the first HV single gate transistor MGP1 remains off, thereby electrically coupling the second translator node Nb to the first voltage source Vpp, and the first translator node Na to the second voltage source Vss.

When the second dual gate transistor DGN2 is on (the first dual gate transistor DGN1 is off), the first HV single gate transistor MGP1 is on whereas the second HV single gate transistor MGP2 remains off, thereby electrically coupling the first translator node Na to the first voltage source Vpp, and the second translator node Nb to the second voltage source Vss. Thus, the LV to HV level translator circuit 600A can provide a higher voltage swing ranging, for example, from about 0V to about +100V in response to a lower voltage swing of the T/R control signal $C_{TR}$ ranging, for example, from about 3V to about 10V, for example, about 5V.

Referring now to FIG. 6B, a LV to HV level translator circuit 600B can also serve to provide a control signal, for example, the MOSFET switch control signal $C_M$ in FIG. 2 in response to another control signal, for example, the T/R control signal $C_{TR}$ of FIG. 2. In certain embodiments, the LV to HV level translator circuit 600B can provide a control signal supplied to the gate of a p-type transistor, for example, TR1 of FIG. 4A or TR1 and TR4 of FIG. 4B.

In the illustrated embodiment, the LV to HV level translator circuit 600B includes a third HV single gate transistor MGN3 and a fourth HV single gate transistor MGN4 cross-coupled to each other. The LV to HV level translator circuit 600B also includes a third dual gate transistor DGP3 and a fourth dual gate transistor DGP4. In some embodiments, the configurations of the HV single gate transistors MGN3, MGN4 and the dual gate transistors DGP3, DGP4 can be as described above in connection with FIGS. 3B-3D. A skilled artisan will, however, appreciate that the HV single gate transistors MGN3, MGN4 and the dual gate transistors DGP3, DGP4 can be replaced with any other suitable transistors or switching devices.

The third HV single gate transistor MGN3 can include a drain coupled to a third translator node Nc, a source coupled to a third voltage source Vnn, and a gate coupled to a fourth translator node Nd. The third voltage source Vnn can have a voltage between about −20V and about −200V, and preferably between about −50V and about −120V, for example, −100V. A second MOSFET switch control signal $C_{M2}$ can be outputted from the fourth translator node Nd and an inverted second MOSFET switch control signal $C_{M2b}$ can be outputted from the third translator node Nc.

The fourth HV single gate transistor MGN4 can include a drain coupled to the fourth translator node Nd, a source coupled to the third voltage source Vnn, and a gate coupled to the third translator node Nc. The third HV single gate transistor MGN3 and the fourth HV single gate transistor MGN4 are n-type transistors.

The third dual gate transistor DGP3 can include a source coupled to a fourth voltage source $V_{dd}$, a drain coupled to the third translator node Nc, and a gate configured to receive a control signal, for example, the T/R control signal $C_{TR}$ of FIG. 2. The fourth voltage source $V_{dd}$ can have a voltage of, for example, 0V. The fourth dual gate transistor DGP4 can include a source coupled to the fourth voltage source $V_{dd}$, a drain coupled to the fourth translator node Nd, and a gate configured to receive an inverted control signal, for example, a signal $C_{TRb}$ inverted from the T/R control signal $C_{TR}$ of FIG. 2.

During the operation of the LV to HV level translator circuit 600B, one of the third and fourth dual gate transistors DGP3, DGP4 is on whereas the other of the third and fourth dual gate transistors DGP3, DGP4 is off, depending on the voltage level of the T/R control signal $C_{TR}$. When the third dual gate transistor DGP3 is on (the fourth dual gate transistor DGP4 is off), the fourth HV single gate transistor MGN4 is on whereas the third HV single gate transistor MGN3 remains off, thereby electrically coupling the fourth translator node Nd to the third voltage source Vnn, and the third translator node Nc to the fourth voltage source Vdd.

When the fourth dual gate transistor DGP4 is on (the third dual gate transistor DGP3 is off), the third HV single gate transistor MGN3 is on whereas the fourth HV single gate transistor MGN4 remains off, thereby electrically coupling the third translator node Nc to the third voltage source Vnn, and the fourth translator node Nd to the fourth voltage source Vdd. Thus, the LV to HV level translator circuit 600B can provide a higher voltage swing ranging, for example, from about −100V to about 0V from a lower voltage swing of the T/R control signal $C_{TR}$ ranging, for example, from about 3V to about 10V, for example, about 5V.

Figure 7:
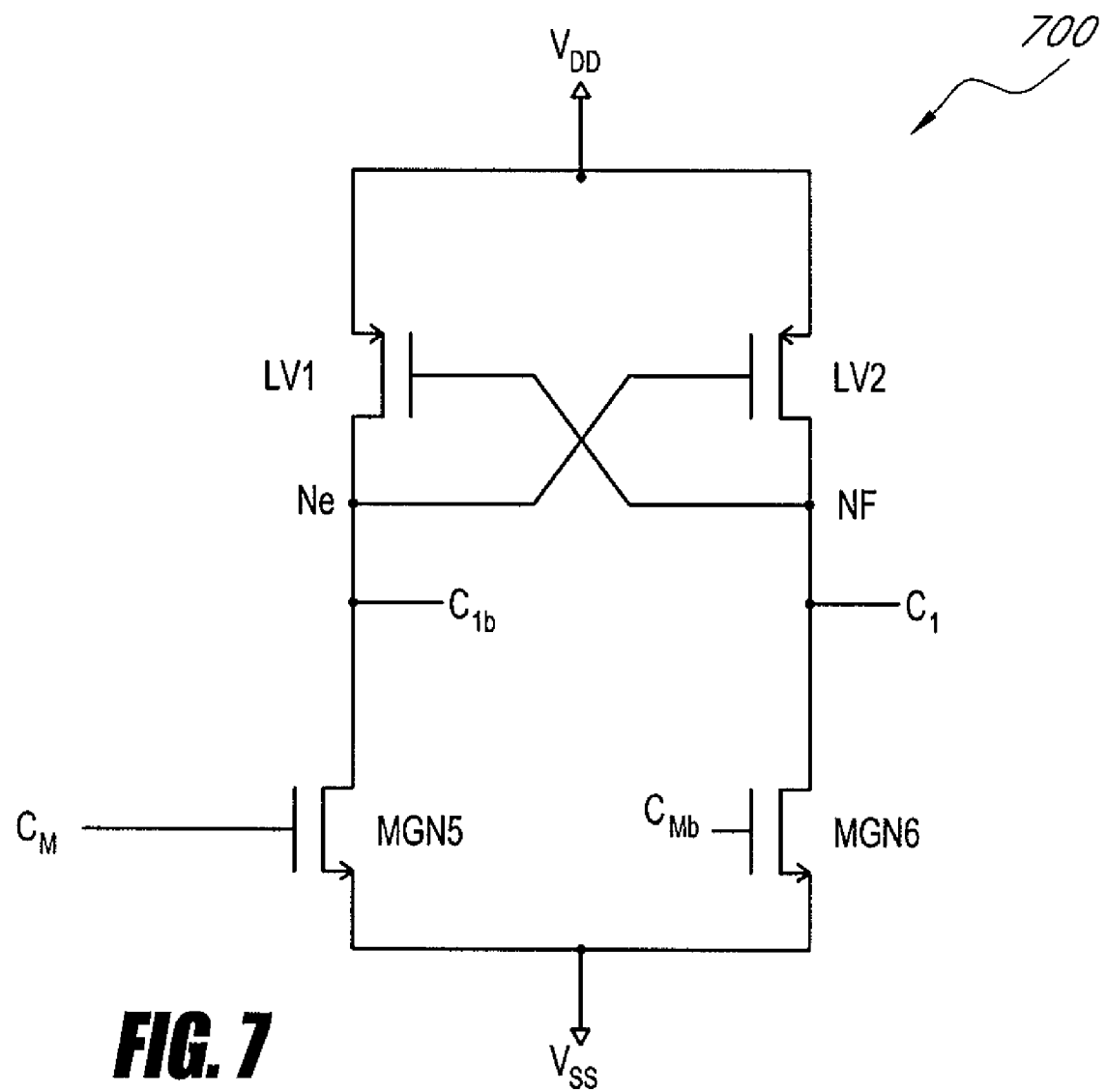
FIG. 7 is a circuit diagram of a high voltage (HV) to low voltage (LV) level translator for use in the transmit/receive switch of FIG. 2 according to one embodiment.

Referring to FIG. 7, one embodiment of the HV to LV level translator 230 of FIG. 2 will be described below. The illustrated HV to LV level translator circuit 700 can serve to provide a control signal, for example, the first clamp control signal $C_1$ of FIG. 2 in response to another control signal, for example, the MOSFET switch control signal $C_M$ in FIG. 2.

In the illustrated embodiment, the HV to LV level translator circuit 700 includes a first low voltage transistor LV1 and a second low voltage transistor LV2 cross-coupled to each other. The HV to LV level translator circuit 700 also includes a fifth HV single gate transistor MGN5 and a sixth HV single gate transistor MGN6. The low voltage transistors LV1, LV2 can be any suitable transistor that can operate with a gate voltage ranging from about 3V to about 10V, for example, about 5V. In some embodiments, the configurations of the HV single gate transistors MGN5, MGN6 can be as described above in connection with FIGS. 3B and 3C. A skilled artisan will, however, appreciate that the HV single gate transistors MGN5, MGN6 can be replaced with any other suitable transistors or switching devices.

The first low voltage transistor LV1 can include a source coupled to a fifth voltage source $V_{DD}$, a drain coupled to a fifth translator node Ne, and a gate coupled to a sixth translator node Nf. The fifth voltage source $V_{DD}$ can have a voltage between about 3V to about 10V, for example, about 5V.

The second low voltage transistor LV2 can include a source coupled to the fifth voltage source $V_{DD}$, a drain coupled to the sixth translator node Nf, and a gate coupled to the fifth translator node Ne. The first clamp control signal $C_1$ can be outputted from the sixth translator node Nf and an inverted first clamp control signal $C_{1b}$ can be provided from the fifth translator node Ne. The low voltage transistors LV1 and LV2 are p-type transistors.

The fifth HV single gate transistor MGN5 can include a drain coupled to the fifth translator node Ne, a source coupled to a sixth voltage source Vss, and a gate configured to receive a control signal, for example, a MOSFET switch control signal $C_M$. The sixth voltage source $V_{SS}$ can have a voltage of, for example, 0V.

The sixth HV single gate transistor MGN6 can include a drain coupled to the sixth translator node Nf, a source coupled to the sixth voltage source Vss, and a gate configured to receive an inverted control signal, for example, a signal $C_{Mb}$ inverted from the MOSFET switch control signal $C_M$. The HV single gate transistors MGN5, MGN6 are n-type transistors.

During the operation of the HV to LV level translator circuit 700, one of the fifth and sixth HV single gate transistors MGN5, MGN6 is on whereas the other of the fifth and sixth HV single gate transistors MGN5, MGN6 is off, depending on the voltage level of the control signal. When the fifth HV single gate transistor MGN5 is on (the sixth HV single gate transistor MGN6 is off), the second low voltage transistor LV2 is on whereas the first low voltage transistor LV1 remains off, thereby electrically coupling the sixth translator node Nf to the fifth voltage source $V_{DD}$, and the fifth translator node Ne to the sixth voltage source Vss. When the sixth HV single gate transistor MGN6 is on (the fifth HV single gate transistor MGN5 is off), the first low voltage transistor LV1 is on whereas the second low voltage transistor LV2 remains off, thereby electrically coupling the fifth translator node Ne to the fifth voltage source $V_{DD}$, and the sixth translator node Nf to the sixth voltage source Vss. Thus, the HV to LV level translator circuit 700 can provide a lower voltage swing ranging, for example, from about 3V to about 10V from a higher voltage swing of the control signal ranging, for example, from about 20 V to about 200V, and preferably from about 50V to about 120V.

Operation of Transmit/Receive Switching Circuit

In this document, some signals are described as being "ON" or "OFF." Such signals can be provided to certain circuit components. When the signals are "ON," the circuit components receiving the signals can be turned on. In contrast, when the signals are "OFF," the circuit components receiving the signals can be turned off. The designations of "ON" and "OFF" can correspond to positive logic (active high) and negative logic (active low), respectively.

Figure 8:
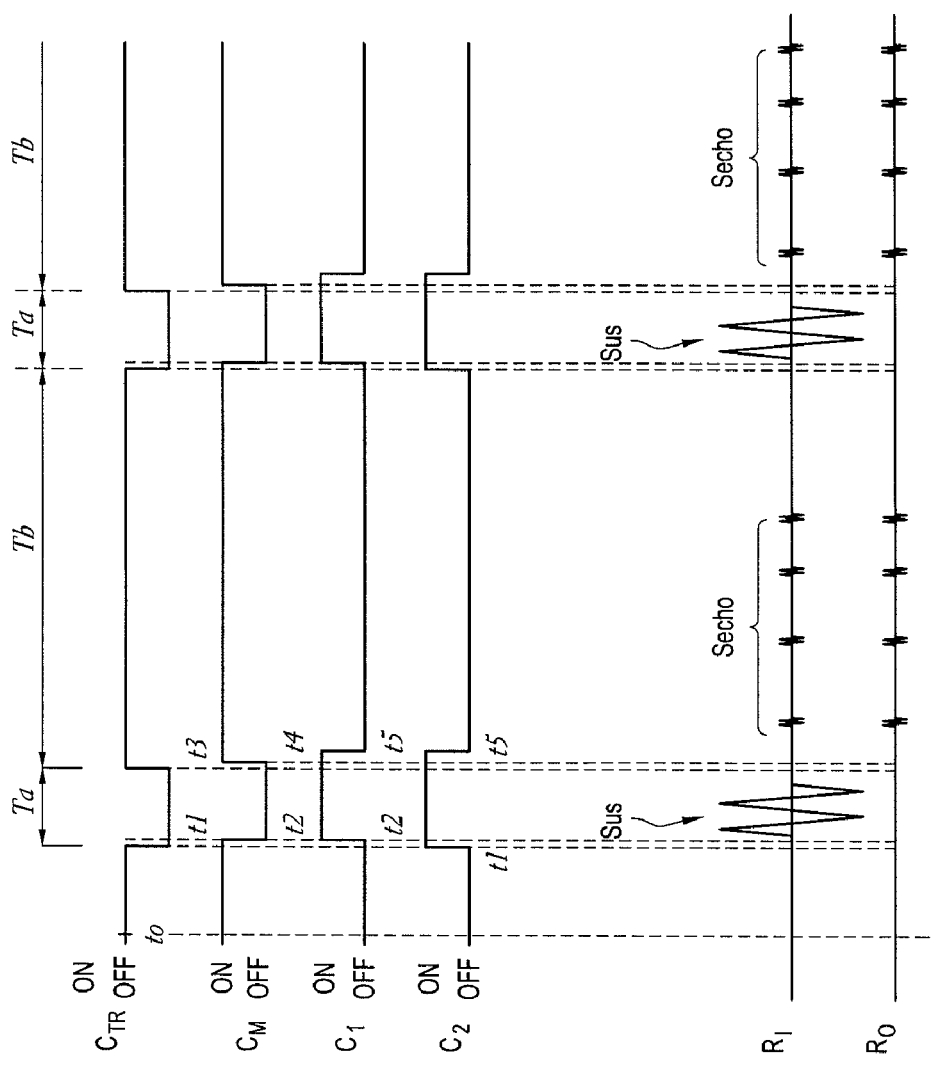
FIG. 8 is a timing diagram illustrating the operation of the transmit/receive switch of FIG. 2 according to one embodiment.

Referring to FIGS. 1, 2 and 8, the operation of the T/R switch 200 will be described below. At time t0, the T/R control signal $C_{TR}$ is ON, and the MOSFET switch control signal $C_M$ is ON so as to turn on the HV MOSFET switch 210. Further, the first clamp control signal $C_1$ is OFF, and the second clamp control signal $C_2$ is OFF so as to turn off the clamp circuit 250.

At time t1, the T/R control signal $C_{TR}$ transitions to OFF, and stays OFF for a first time period Ta (which can be alternatively referred to as a "transmit period"). The T/R control signal $C_{TR}$ then transitions back to ON, and stays ON again for a second time period Tb (which can be alternatively referred to as a "receive period"). The second time period Tb is substantially longer than the first time period Ta. For example, the second time period Tb is about 50 to about 500 times longer than the first time period Ta.

When the T/R control signal $C_{TR}$ transitions to OFF at time t1, the clamp control latch 240 outputs the second clamp control signal $C_2$ in ON state in response to the transition of the T/R control signal $C_{TR}$, thereby turning on the clamp circuit 250. The clamp circuit 250, when turned on, couples the second node N2 to ground, thereby routing any signal to ground to ensure the protection of the receiver 130 (FIG. 1).

At time t2, the MOSFET switch control signal $C_M$ is turned OFF in response to the transition of the T/R control signal $C_{TR}$. The transition of the MOSFET switch control signal $C_M$ is delayed from t1 by a selected period of time, for example, from about 50 ns to about 500 ns by the LV to HV level translator 220. The MOSFET switch control signal $C_M$ turns off the HV MOSFET switch 210 such that no signal passes therethrough. At time t2, the first clamp signal $C_1$ is turned ON in response to the MOSFET switch control signal $C_M$ by the HV to LV level translator 230.

At time t3, the T/R control signal $C_{TR}$ transitions back to ON. Then, at time t4, the MOSFET switch control signal $C_M$ is turned ON in delayed response to the transition of the T/R control signal $C_{TR}$. The transition of the MOSFET switch control signal $C_M$ is delayed from t3 by a selected period of time, for example, from about 50 ns to about 500 ns. The MOSFET switch control signal $C_M$ turns on the HV MOSFET switch 210 to allow echo signals to reach the receiver 130 (FIG. 1).

At time t5, the first clamp signal $C_1$ is turned OFF in response to the MOSFET switch control signal $C_M$. The transition of the first clamp signal $C_1$ is delayed from t4 by a selected period of time, for example, from about 100 ns to about 300 ns. The second clamp control signal $C_2$ is turned ON in response to the transition of the first clamp signal $C_1$, thereby turning off the clamp circuit 250. The clamp circuit 250, when turned off, lets the received signal at the second node N2 follow that of the first node N1. The same process is repeated during the subsequent cycles of the transmit and receive periods.

During the transmit periods Ta, bursts of high voltage ultrasound signals are transmitted from the transmitter 120 through the cable 114 to the transducer array 112 (FIG. 1), as shown in FIG. 8. The ultrasound signals $S_{US}$ reach the T/R switch 200 as an input signal $R_I$ (see $R_I$ in FIG. 8). However, because the HV MOSFET switch 210 is off, the ultrasound signals $S_{US}$ do not propagate to the receiver 130, thereby protecting the receiver 130. In addition, the clamp circuit 250 shorts the second node N2 to ground between the time t1 and the time t5, and thus ensures that the ultrasound signals $S_{US}$ do not reach the receiver 130, while minimizing switching artifacts.

During the receive periods Tb, echo signals $S_{echo}$ propagate through the transducer array 112, the cable 114, and the T/R switch 160 (FIG. 1), and are detected by the receiver 130. The echo signals $S_{echo}$ are supplied as an input signal $R_I$ to the T/R switch 200 (see $R_I$ in FIG. 8). Because the HV MOSFET switch 210 is on and the clamp circuit 250 is off, the echo signals $S_{echo}$ can propagate to the receiver 130 for detection. The echo signals $S_{echo}$ that are outputted from the T/R switch 200 during the receive periods are shown in FIG. 8 (see $R_O$ in FIG. 8).

Transmit/Receive Switching Circuit with Fault Detection

Figure 9:
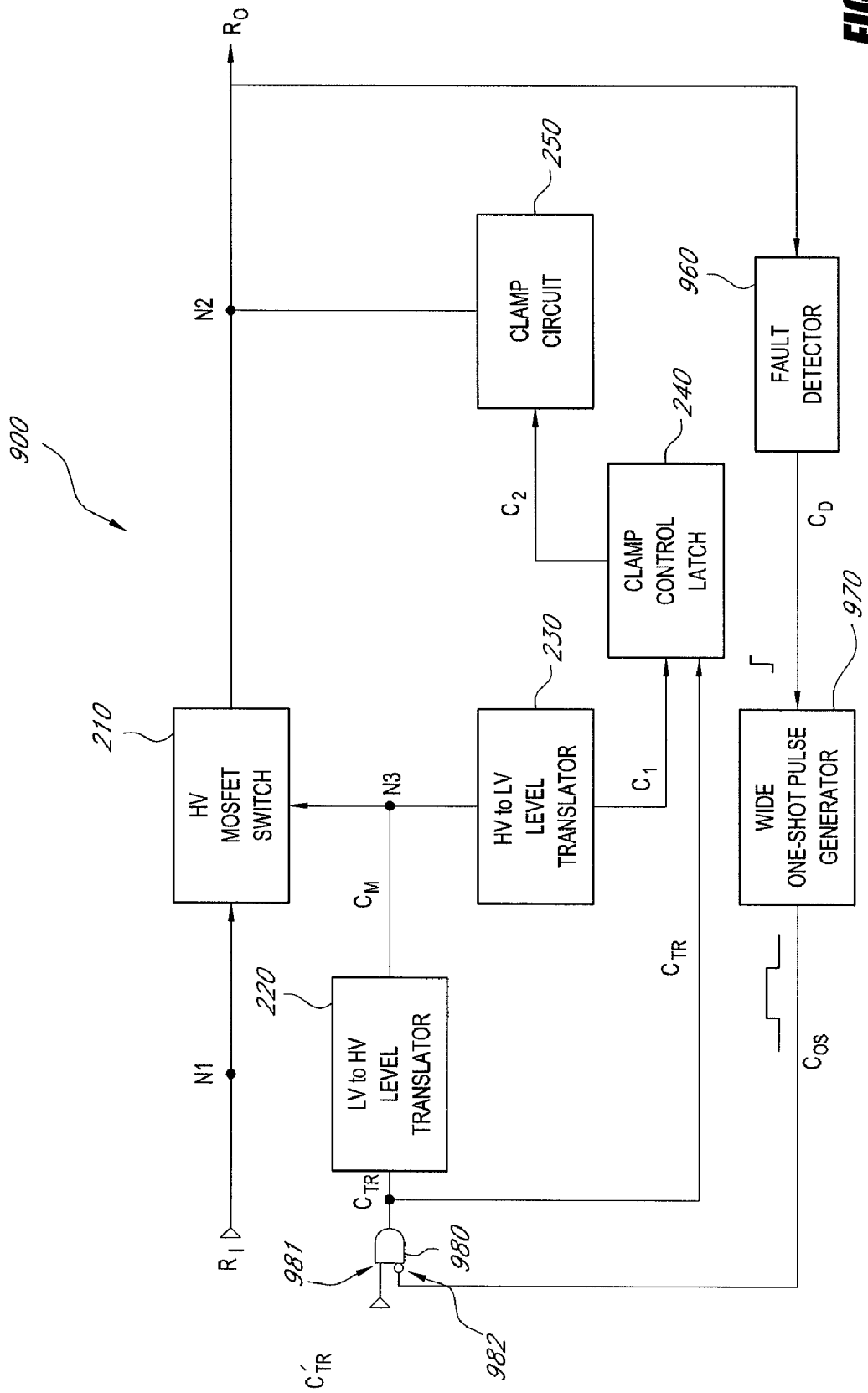
FIG. 9 is a block diagram illustrating a transmit/receive switch according to another embodiment.

Referring to FIG. 9, a T/R switch according to another embodiment will be described below. In the illustrated embodiment, the T/R switch 900 includes a high voltage (HV) MOSFET switch 210, a low voltage to high voltage (LV to HV) level translator 220, a high voltage to low voltage (HV to LV) level translator 230, a clamp control latch 240, a clamp circuit 250, a fault detector 960, a one-shot pulse generator 970, and a logic gate 980.

The HV MOSFET switch 210 is connected between a first node N1 and a second node N2. The HV MOSFET switch 210 receives an input signal $R_I$. Other details of the HV MOSFET switch 210 can be as described above with respect to the HV MOSFET switch 210 in connection with FIGS. 2 and 3A-4B.

The LV to HV level translator 220 is configured to receive a transmit/receive control signal $C_{TR}$, and generate a MOSFET switch control signal $C_M$ at least partly in response to the transmit/receive control signal $C_{TR}$. Other details of the LV to HV level translator 220 can be as described earlier with respect to the LV to HV level translator 220 in connection with FIGS. 2, 6A, and 6B.

The HV to LV level translator 230 is configured to receive the MOSFET switch control signal $C_M$, and generate a first clamp control signal $C_1$ at least partly in response to the MOSFET switch control signal $C_M$. Other details of the HV to LV level translator 230 can be as described above with respect to the HV to LV level translator 230 in connection with FIGS. 2 and 7.

The clamp control latch 240 is configured to receive the first clamp control signal $C_1$ and the transmit/receive control signal $C_{TR}$, and generate a second clamp control signal $C_2$ at least partly in response to one or more of the signals $C_1$ and $C_{TR}$. Other details of the clamp control latch 240 can be as described above with respect to the clamp control latch 240 in connection with FIG. 2.

The clamp circuit 250 is configured to receive the second clamp control signal $C_2$. Details of the clamp circuit 250 can be as described above with respect to the clamp circuit 250 in connection with FIGS. 2 and 5A-5C.

The fault detector 960 is coupled to the second node N2, and is configured to detect a relatively high voltage at the node N2 that can adversely affect the receiver 130 (FIG. 1). For example, the relatively high voltage can be higher in absolute magnitude than about 0.8V to about 1V. For example, if the voltage at the second node N2 is above 1V or below −1V, the fault detector 960 triggers. When the fault detector 960 detects such a high voltage at the second node N2, it can generate a detection signal $C_D$. In one embodiment, the fault detector 960 comprises a comparator and a voltage reference. In another embodiment, the fault detector 960 can include inverters with skewed size ratios set such that the switch point is very near, only slightly above the threshold voltage (for example, about 0.7V) of a low voltage NMOS transistor. Various other configurations of circuits that can selectively detect a signal having a voltage level greater than a selected level can be used for the fault detector 960.

The one-shot pulse generator 970 is configured to receive the detection signal $C_D$ from the fault detector 960. Upon receiving the detection signal $C_D$, the one-shot pulse generator 970 generates a wide one-shot pulse that has a selected duration. The duration can be substantially equal to or greater than one of the transmit periods. The one-shot pulse generator 970 provides the wide one-shot pulse to the logic gate 980. In an alternative embodiment, a resettable latch can be used in place of the one-shot generator 970.

The logic gate 980 receives a raw T/R control signal $C_{TR}'$ and the wide one-shot pulse, and provides the transmit/receive control signal $C_{TR}$. The illustrated logic gate 980 is an AND gate, but other types of logic gates can be used, depending on the design of the circuit. The AND gate 980 includes a non-inverting input 981 and an inverting input 982. The AND gate 980 receives the T/R control signal $C_{TR}'$ at the non-inverting input 981 and the wide one-shot pulse at the inverting input 982. During the operation, the AND gate 980 outputs the raw T/R control signal $C_{TR}'$ as the transmit/receive control signal $C_{TR}$ when it does not receive the wide one-shot pulse, i.e., the inverting input is low. However, the AND gate 980 changes the transmit/receive control signal $C_{TR}$ to be low when it receives the wide one-shot pulse, i.e., the inverting input is high.

When the transmit/receive control signal $C_{TR}$ is low, the HV MOSFET switch 210 is off and the clamp circuit 250 is on. Thus, a signal at the first node N1 is blocked and any residual signal that leaks through the HV MOSFET switch 210 is shunted to ground.

In certain instances, a high voltage transmit signal can be generated by error during a receive mode when the HV MOSFET switch 210 is on. In such instances, the fault detector 960 can detect the high voltage transmit signal, and output a detection signal $C_D$. The one-shot pulse generator 970 generates a wide one-shot pulse and provides it to the AND gate 980. The AND gate 980 generates a low transmit/receive control signal $C_{TR}$, which turns on the clamp circuit 950 and/or turns off the HV MOSFET switch 910. Thus, the high voltage transmit signal is blocked at the T/R switch 900, thereby protecting the receiver 130 (FIG. 1) from the high voltage transmit signal.

In another embodiment, the one-shot pulse generator 970 can be replaced with a latch. The latch can be configured to be set in response to a detection signal from the fault detector 960, and to be reset in response to a control signal provided by a controller (not shown). The clamp circuit 250 can be configured to be turned on when the latch is set, and/or the one or more MOSFETs are configured to be turned off when the latch is set.

Transmit/Receive Switching Circuit with Switch Gate Clamp

Figure 10A:
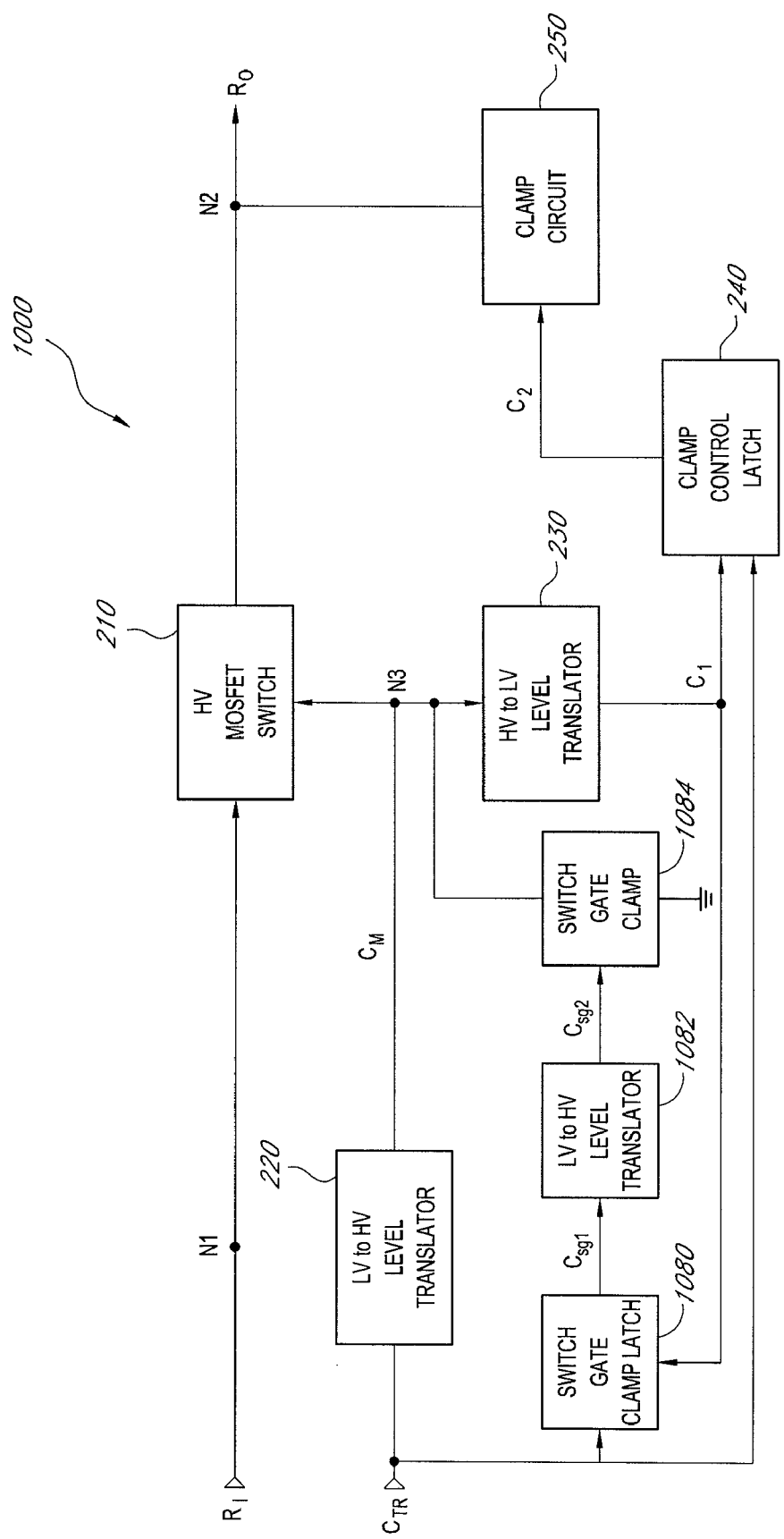
FIG. 10A is a block diagram illustrating a transmit/receive switch according to yet another embodiment.

Referring to FIG. 10A, a T/R switch according to yet another embodiment will be described below. In the illustrated embodiment, the T/R switch 1000 includes a high voltage (HV) MOSFET switch 210, a first low voltage to high voltage (LV to HV) level translator 220, a high voltage to low voltage (HV to LV) level translator 230, a clamp control latch 240, a clamp circuit 250, a switch gate clamp latch 1080, a second low voltage to high voltage (LV to HV) level translator 1082, and a switch gate clamp 1084.

The HV MOSFET switch 210 is connected between a first node N1 and a second node N2. The HV MOSFET switch 210 receives an input signal $R_I$. Other details of the HV MOSFET switch 210 can be as described above with respect to the HV MOSFET switch 210 in connection with FIGS. 2 and 3A-4B.

The first LV to HV level translator 220 is configured to receive a T/R control signal $C_{TR}$, and generate a MOSFET switch control signal $C_M$ at least partly in response to the T/R control signal $C_{TR}$. The first LV to HV level translator 220 provides the MOSFET switch control signal $C_M$ to the HV MOSFET switch 210 and the HV to LV level translator 230 via a third node N3. Other details of the first LV to HV level translator 220 can be as described above with respect to the LV to HV level translator 220 in connection with FIGS. 2, 6A, and 6B.

The HV to LV level translator 230 is configured to receive the MOSFET switch control signal $C_M$, and generate a first clamp control signal $C_1$ at least partly in response to the MOSFET switch control signal $C_M$. Other details of the HV to LV level translator 230 can be as described above with respect to the HV to LV level translator 230 in connection with FIGS. 2 and 7.

The clamp control latch 240 is configured to receive the first clamp control signal $C_1$ and the T/R control signal $C_{TR}$, and generate a second clamp control signal $C_2$ at least partly in response to one or more of the signals $C_1$ and $C_{TR}$. Other details of the clamp control latch 240 can be as described above with respect to the clamp control latch 240 in connection with FIG. 2.

The clamp circuit 250 is configured to receive the second clamp control signal $C_2$. Details of the clamp circuit 250 can be as described above with respect to the clamp circuit 250 in connection with FIGS. 2 and 5A-5C.

The switch gate clamp latch 1080 is configured to receive the first clamp control signal $C_1$ and the T/R control signal $C_{TR}$, and generate a low voltage (LV) switch gate signal $C_{sg1}$ at least partly in response to one or more of the signals $C_1$ and $C_{TR}$. The switch gate clamp latch 1080 is also configured to hold the LV switch gate signal $C_{sg1}$ for a selected period of time. In some embodiments, the switch gate clamp latch 1080 can include a pair of cross-coupled logic gates, for example, cross-coupled NOR gates.

The second low voltage to high voltage (LV to HV) level translator 1082 is configured to receive the LV switch gate signal $C_{sg1}$ and generate a high voltage (HV) switch gate signal $C_{sg2}$ in response to the LV switch gate signal $C_{sg1}$. The HV switch gate signal $C_{sg2}$ is provided to the switch gate clamp 1084 to turn on or off the switch gate clamp 1084. Other details of the second LV to HV level translator 1082 can be as described above with respect to the LV to HV level translator 220 in connection with FIGS. 2, 6A, and 6B.

The switch gate clamp 1084 is coupled between the third node N3 and ground. The switch gate clamp 1084 can include one or more switches that couple the third node N3 to ground when turned on. When the switch gate clamp 1084, is turned on, the third node N3 will already have been driven to ground (or Vss) by the LV to HV level translator 220. However, the switch gate clamp 1084 lowers the resistance of the connection to ground, thereby shunting a parasitic high voltage ultrasound signal feed-through, and holding the HV MOSFET switch 210 more firmly off. Thus, by coupling the third node N3 to ground, the switch gate clamp 984 can ensure that the HV MOSFET switch 210 is turned off, thereby protecting the receiver 130 (FIG. 1) from high voltage ultrasound signals.

Figure 10B:
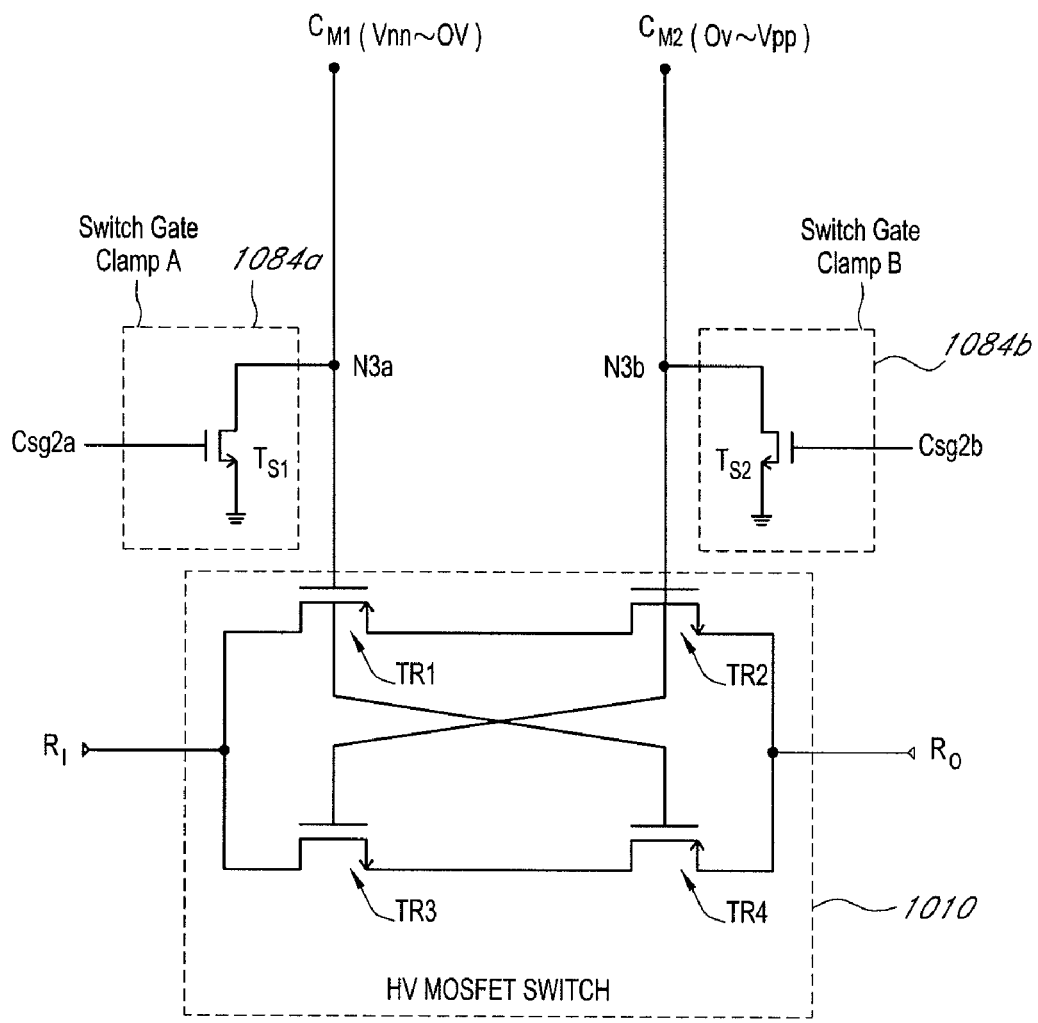
FIG. 10B is a circuit diagram illustrating a HV MOSFET switch and a switch gate clamp in the transmit/receive switch of FIG. 10A according to one embodiment.

Referring to FIG. 10B, switch gate clamps according to one embodiment will be described below. FIG. 10B only shows a HV MOSFET switch 210 and first and second switch gate clamps 1084a, 1084b. However, a skilled artisan will appreciate that the HV MOSFET switch 210 and first and second switch gate clamps 1084a, 1084b can be implemented as part of the T/R switch 1000 of FIG. 10A. The illustrated HV MOSFET switch 210 is identical to the T/R switch 410B of FIG. 4B. Thus, details of the HV MOSFET switch can be as described above in connection with FIG. 4B. A skilled artisan will also appreciate that the configuration of the HV MOSFET switch can also be as described above in connection with FIG. 4A.

The first switch gate clamp 1084a includes a first NMOS transistor Ts1. The first NMOS transistor Ts1 includes a drain coupled to a first switch gate node N3a, a source coupled to ground, and a gate configured to receive a first HV switch gate signal $C_{sg2a}$.

The second switch gate clamp 1084b includes a second NMOS transistor Ts2. The second NMOS transistor Ts2 includes a drain coupled to a second switch gate node N3b, a source coupled to ground, and a gate configured to receive a second HV switch gate signal $C_{sg2b}$. In other embodiments, PMOS transistors can be used in place of the first and second NMOS transistors Ts1, Ts2.

During operation, a first MOSFET control signal $C_{M1}$ is provided to the gates of the first and fourth transistors TR1, TR4, which are PMOS transistors. A second MOSFET control signal $C_{M2}$ is provided to the gates of the second and third transistors TR2, TR3, which are NMOS transistors. For example, the first MOSFET control signal $C_{M1}$ can switch the first and fourth transistors TR1, TR4 between Vnn and 0V, where Vnn has a negative voltage level, for example, from about −20V to about −200V, and preferably from about −50V to about −120V. The second MOSFET control signal $C_{M2}$ can switch the second and third transistors TR2, TR3 between 0V and Vpp, where Vpp has a positive voltage level of, for example, from about 20 V to about 200V, and preferably about 50V to about 120V.

When the first MOSFET control signal $C_{M1}$ is at Vnn and the second MOSFET control signal $C_{M2}$ is at Vpp, the first to fourth transistors are on, thereby keeping the HV MOSFET switch 210 on. When the first MOSFET control signal $C_{M1}$ is at 0V and the second MOSFET control signal $C_{M2}$ is at 0V, the first to fourth transistors are off, thereby keeping the HV MOSFET switch 210 off. However, the first MOSFET control signal $C_{M1}$ and the second MOSFET control signal $C_{M2}$ may not be strong enough to hold the gates of the first to fourth transistors TR1-TR4 firmly enough to ground in the presence of a high voltage ultrasound transmit signal.

During a transmit period, the first and second HV switch gate signals $C_{sg2a}$, $C_{sg2b}$ are provided to the first NMOS transistor Ts1 and the second NMOS transistor Ts2, respectively, thereby turning on the transistors Ts1, Ts2. Thus, the first and second switch gate nodes N3a, N3b are coupled to ground. This operation can further ensure that the gates of the first to fourth transistors TR1-TR4 are coupled to ground, thereby turning off the transistors TR1-TR4. Thus, the receiver 130 (FIG. 1) can be protected from bursts of ultrasound pulses.

In yet another embodiment, the T/R switch 1000 shown in FIG. 10A can be further provided with the fault detection as described above in connection with FIG. 9. In such an embodiment, the T/R switch 1000 can further include a fault detector, a wide one-shot pulse generator, and a logic gate, for example, an AND gate. Details of the fault detector, the wide one-shot pulse generator, and the logic gate can be as described above in connection with FIG. 9.

In the embodiments described above, the T/R switches were described in conjunction with an ultrasound system. A skilled artisan will, however, appreciate that the configurations and principles of the T/R switches can be adapted for use in any other systems or apparatuses that have needs for such a T/R switch.

Thus, the T/R switches according to the embodiments described above can be implemented into various electronic devices, such as medical equipment, inspection equipment, or ranging equipment. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:
1. An apparatus comprising:
a transmitter coupled to an ultrasonic transducer at a first node, the transmitter being configured to generate an ultrasound signal during a transmit period;
a transmit/receive switch having an input coupled to the first node, wherein the transmit/receive switch further comprises:
one or more field effect transistors (FETs) coupled between the first node and a second node, wherein the one or more FETs are configured to be turned on during a receive period to couple the first node and the second node such that an echo signal is passed from the first node to the second node during the receive period, and to be turned off during the transmit period to substantially block the ultrasound signal from the second node; and a clamp circuit coupled to the second node, wherein the clamp circuit is configured to protect the second node from excess voltages; and a receiver having an input coupled to the second node to receive the echo signal, wherein the echo signal comprises echoes of the ultrasound signal.

2. The apparatus of claim 1, wherein the clamp circuit comprises a switch configured to be on during the transmit period.

3. The apparatus of claim 2, wherein the switch is further configured to be turned on at a first time before the transmit period starts.

4. The apparatus of claim 2, wherein the switch is further configured to be turned off at a second time after the transmit period ends.

5. The apparatus of claim 1, further comprising a low voltage to high voltage (LV to HV) level translator configured to generate a MOSFET control signal for switching on or off the one or more MOSFETs at least partly in response to a transmit/receive control signal.

6. The apparatus of claim 5, further comprising a high voltage to low voltage (HV to LV) level translator configured to generate a first clamp control signal for controlling the switching of the clamp circuit at least partly in response to the MOSFET control signal.

7. The apparatus of claim 6, wherein the HV to LV level translator comprises:
a first low voltage MOSFET including a source coupled to a first voltage source, a drain coupled to a first translator node, and a gate coupled to a second translator node;
a second low voltage MOSFET including a source coupled to the first voltage source, a drain coupled to the second translator node, and a gate coupled to the first translator node;
a first high voltage single gate transistor including a drain coupled to the first translator node, a source coupled to a second voltage source, and a gate coupled to receive the MOSFET control signal; and
a second high voltage single gate transistor including a drain coupled to the second translator node, a source coupled to the second voltage source, and a gate coupled to receive a signal inverted from the MOSFET control signal.

8. The apparatus of claim 1, wherein the clamp circuit comprises a MOSFET including a drain coupled to the output node, a source coupled to ground, and a gate configured to receive the second clamp control signal.

9. The apparatus of claim 8, wherein the clamp circuit further comprises a resistor including a first end coupled to the second node, and a second end coupled to ground.

10. The apparatus of claim 8, wherein the clamp circuit further comprises a first diode and a second diode, wherein the first diode includes an anode coupled to the second node, and a cathode coupled to ground, and wherein the second diode includes an anode coupled to ground, and a cathode coupled to the second node.

11. The apparatus of claim 1, wherein the one or more MOSFETs comprise a high voltage MOSFET controllable by a gate signal ranging from about 20V to about 200V, or from about −20V to about −200V.

12. The apparatus of claim 11, wherein the high voltage MOSFET comprises:
a substrate;

a source region formed into the substrate, the source region being annular when viewed from above the substrate;
a drain region formed into the substrate, the drain region being laterally surrounded by the source region;
a channel region defined between the source and drain regions; and
a gate overlying the channel region, the gate extending from over a portion of the drain region to the source region.

13. The apparatus of claim 1, wherein the one or more MOSFETs comprise:
a first MOSFET including a first drain electrically coupled to the input node, a first source, and a first gate; and
a second MOSFET including a second drain electrically coupled to the first source of the first MOSFET, a second source electrically coupled to the output node, and a second gate,
wherein the first MOSFET has a polarity opposite to the polarity of the second MOSFET.

14. The apparatus of claim 13, wherein the one or more MOSFETs further comprise:
a third MOSFET including a third drain electrically coupled to the input node, a third source, and a third gate; and
a fourth MOSFET including a fourth drain electrically coupled to the third source of the third MOSFET, a fourth source electrically coupled to the output node, and a second gate,
wherein the third MOSFET has a polarity opposite to the polarity of the fourth MOSFET, and
wherein the third MOSFET has the same polarity as the polarity of the second MOSFET.

15. The apparatus of claim 1, further comprising:
a fault detector configured to detect if a voltage level at the output node is greater than a selected voltage, and to generate a detection signal if the voltage level at the output node is greater than the selected voltage; and
a one-shot pulse generator configured to generate a pulse having a selected duration upon receiving the detection signal from the fault detector,
wherein the clamp circuit is configured to be turned on during the selected duration, and/or the one or more MOSFETs are configured to be turned off during the selected duration.

16. The apparatus of claim 1, further comprising:
a fault detector configured to detect if a voltage level at the output node is greater than a selected voltage, and to generate a detection signal if the voltage level at the output node is greater than the selected voltage; and
a latch configured to be set in response to the detection signal, and to be reset in response to a control signal provided by a controller,
wherein the clamp circuit is configured to be turned on when the latch is set, and/or the one or more MOSFETs are configured to be turned off when the latch is set.

17. The apparatus of claim 1, wherein each of the one or more MOSFETs includes a gate, and wherein the apparatus further comprises one or more switch gate clamps configured to electrically couple one or more of the gates of the MOSFETs to ground at least during the transmit period.

18. The apparatus of claim 1, wherein the echo signal being the echo signal comprises a portion of the ultrasound signal reflected by an object.

19. An apparatus comprising:
a transmitter coupled to an ultrasonic transducer at a first node, the transmitter being configured to generate a first signal during a transmit period;

a transmit/receive switch having an input coupled to the first node, wherein the transmit/receive switch further comprises:
  one or more field effect transistors (FETs) coupled between the first node and a second node, wherein the one or more FETs are configured to be turned on during a receive period to couple the first node and the second node such that a second signal is passed from the first node to the second node during the receive period, and to be turned off during the transmit period to substantially block the first signal from the second node; and
  a clamp circuit coupled to the second node, wherein the clamp circuit is configured to protect the second node from excess voltages;
a receiver having an input coupled to the second node to receive a second signal during the receive period, wherein the second signal is intended to comprise echoes of the first signal; and
a low voltage to high voltage (LV to HV) level translator configured to generate a MOSFET control signal for switching on or off the one or more MOSFETs at least partly in response to a transmit/receive control signal, wherein the LV to HV level translator comprises:
a first high voltage single gate transistor including a source coupled to a first voltage source, a drain coupled to a first translator node, and a gate coupled to a second translator node;
a second high voltage single gate transistor including a source coupled to the first voltage source, a drain coupled to the second translator node, and a gate coupled to the first translator node;
a first dual gate transistor including a drain coupled to the first translator node, a source coupled to a second voltage source, and a gate coupled to receive the transmit/receive control signal; and
a second dual gate transistor including a drain coupled to the second translator node, a source coupled to the second voltage source, and a gate coupled to receive a signal inverted from the transmit/receive control signal.

20. An apparatus comprising:
a transmitter coupled to an ultrasonic transducer at a first node, the transmitter being configured to generate a first signal during a transmit period;
a transmit/receive switch having an input coupled to the first node, wherein the transmit/receive switch further comprises:
  one or more field effect transistors (FETs) coupled between the first node and a second node, wherein the one or more FETs are configured to be turned on during a receive period to couple the first node and the second node such that a second signal is passed from the first node to the second node during the receive period, and to be turned off during the transmit period to substantially block the first signal from the second node; and
  a clamp circuit coupled to the second node, wherein the clamp circuit is configured to protect the second node from excess voltages;
a receiver having an input coupled to the second node to receive a second signal during the receive period, wherein the second signal is intended to comprise echoes of the first signal;
a low voltage to high voltage (LV to HV) level translator configured to generate a MOSFET control signal for switching on or off the one or more MOSFETs at least partly in response to a transmit/receive control signal;
a high voltage to low voltage (HV to LV) level translator configured to generate a first clamp control signal for controlling the switching of the clamp circuit at least partly in response to the MOSFET control signal; and
a clamp control latch configured to generate a second clamp control signal at least partly in response to the first clamp control signal, wherein the second clamp control signal is configured to switch on or off the clamp circuit.

21. The apparatus of claim 20, further comprising a controller configured to provide the transmit/receive control signal to the LV to HV level translator and the clamp control latch.

22. The apparatus of claim 20, wherein the clamp circuit comprises a first diode, and a second diode, wherein the first diode includes an anode coupled to the output node, and a cathode coupled to ground, and wherein the second diode includes an anode coupled to ground, and a cathode coupled to the output node.

23. The apparatus of claim 22, wherein the clamp circuit further comprises a resistor, wherein the resistor includes a first end coupled to the output node, and a second end coupled to ground.

24. A method of operating an electronic device, the method comprising:
generating, by a transmitter, an ultrasound signal during a transmit period;
receiving, by a receiver, an echo signal during a receive period; and
electrically blocking the receiver from the transmitter during the transmit period, by turning off one or more metal-oxide-semiconductor field effect transistors (MOSFETs) coupled between an input node and an output node, the input node being electrically coupled to the transmitter, the output node being electrically coupled to the receiver;
passing the echo signal to the receiver during the receive period by turning on the one or more MOSFETs,
wherein electrically blocking the receiver comprises coupling the output node to ground during the transmit period.

25. The method of claim 24, wherein coupling the output node to ground further comprises starting the coupling at a first time before the transmit period starts.

26. The method of claim 25, wherein coupling the output node to ground further comprises finishing the coupling at a second time after the transmit period ends.

27. The method of claim 24, wherein turning on or off the one or more MOSFETs comprises providing the one or more MOSFETs with a gate signal ranging from about 20 V to about 200V, or from about −20V to about −200V.

28. The method of claim 24, further comprising:
detecting if a voltage level at the output node is greater than a selected voltage, and generating a detection signal if the voltage level at the output node is greater than the selected voltage; and
generating a pulse having a selected duration at least partly in response to the detection signal.

29. The method of claim 28, further comprising one or more of:
  (i) coupling the output node to ground during the selected duration, and
  (ii) turning off the one or more MOSFETs during the selected duration.

30. The method of claim 24, wherein each of the one or more MOSFETs includes a gate, and wherein the method further comprises electrically coupling one or more of the gates of the MOSFETs to ground at least during the transmit period.

31. The method of claim 24, wherein generating the ultrasound signal comprises using an ultrasonic transducer.

32. The method of claim 31, wherein the echo signal being the echo signal comprises a portion of the ultrasound signal reflected by an object.

* * * * *

UNITED STATES PATENT AND TRADEMARK OFFICE
CERTIFICATE OF CORRECTION

PATENT NO. : 8,265,569 B2  
APPLICATION NO. : 12/559174  
DATED : September 11, 2012  
INVENTOR(S) : Allen Barlow Page 1 of 1

It is certified that error appears in the above-identified patent and that said Letters Patent is hereby corrected as shown below:

In column 20 at line 61, in Claim 18, after "wherein" delete "the echo signal being".

In column 24 at line 1, in Claim 32, after "wherein" delete "the echo signal being".

Signed and Sealed this
Twenty-sixth Day of February, 2013

Teresa Stanek Rea
*Acting Director of the United States Patent and Trademark Office*